(12) United States Patent
Sato

(10) Patent No.: US 8,895,387 B2
(45) Date of Patent: Nov. 25, 2014

(54) METHOD OF MANUFACTURING NONVOLATILE SEMICONDUCTOR MEMORY DEVICE

(71) Applicant: Kabushiki Kaisha Toshiba, Tokyo (JP)

(72) Inventor: Motoyuki Sato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/946,813

(22) Filed: Jul. 19, 2013

(65) Prior Publication Data

US 2014/0242786 A1 Aug. 28, 2014

(30) Foreign Application Priority Data

Feb. 27, 2013 (JP) ................................. 2013-037563

(51) Int. Cl.
*H01L 21/336* (2006.01)
*H01L 21/425* (2006.01)
*H01L 29/66* (2006.01)

(52) U.S. Cl.
CPC ................................ *H01L 29/66825* (2013.01)
USPC ........... 438/258; 438/257; 438/264; 438/266; 438/514; 438/530

(58) Field of Classification Search
CPC ..................... H01L 21/28185; H01L 21/477
USPC ......... 438/201, 211, 257–264, 514, 530, 533, 438/593–595; 257/314, 315, 321, E21.179, 257/E21.18, E21.422, E21.423
See application file for complete search history.

(56) References Cited

U.S. PATENT DOCUMENTS

| | | | | |
|---|---|---|---|---|
| 6,030,876 A * | 2/2000 | Koike | | 438/303 |
| 6,054,355 A * | 4/2000 | Inumiya et al. | | 438/296 |
| 6,251,729 B1 * | 6/2001 | Montree et al. | | 438/257 |
| 6,531,736 B1 * | 3/2003 | Koike | | 257/335 |
| 6,790,718 B1 * | 9/2004 | Nakagawa | | 438/195 |
| 7,476,582 B2 * | 1/2009 | Nakagawa et al. | | 438/201 |
| 7,825,455 B2 * | 11/2010 | Lee et al. | | 257/315 |
| 2009/0085096 A1 | 4/2009 | Park et al. | | |
| 2012/0028436 A1 * | 2/2012 | Or-Bach et al. | | 438/401 |
| 2012/0146125 A1 | 6/2012 | Kim et al. | | |

FOREIGN PATENT DOCUMENTS

| | | |
|---|---|---|
| JP | 2008-118055 A | 5/2008 |
| JP | 2009-218421 A | 9/2009 |
| JP | 2010-010323 A | 1/2010 |
| JP | 2010-182713 A | 8/2010 |

* cited by examiner

*Primary Examiner* — Fernando L Toledo
*Assistant Examiner* — Christine C Lau
(74) *Attorney, Agent, or Firm* — Holtz, Holtz, Goodman & Chick PC

(57) ABSTRACT

According to one embodiment, a method includes forming first and second gate patterns each including a structure stacked in order of a first insulating layer, a floating gate layer, a charge trap layer, a second insulating layer and a dummy layer on a semiconductor layer, implanting impurities in the semiconductor layer by an ion implantation using the first and second gate patterns as a mask, forming a third insulating layer on the semiconductor layer, the third insulating layer covering side surfaces of the first and second gate patterns, and forming first and second concave portions, the first concave portion formed by removing the dummy layer of the first gate pattern, the second concave portion formed by removing the dummy layer, the second insulating layer, the charge trap layer and the floating gate layer of the second gate pattern.

18 Claims, 34 Drawing Sheets

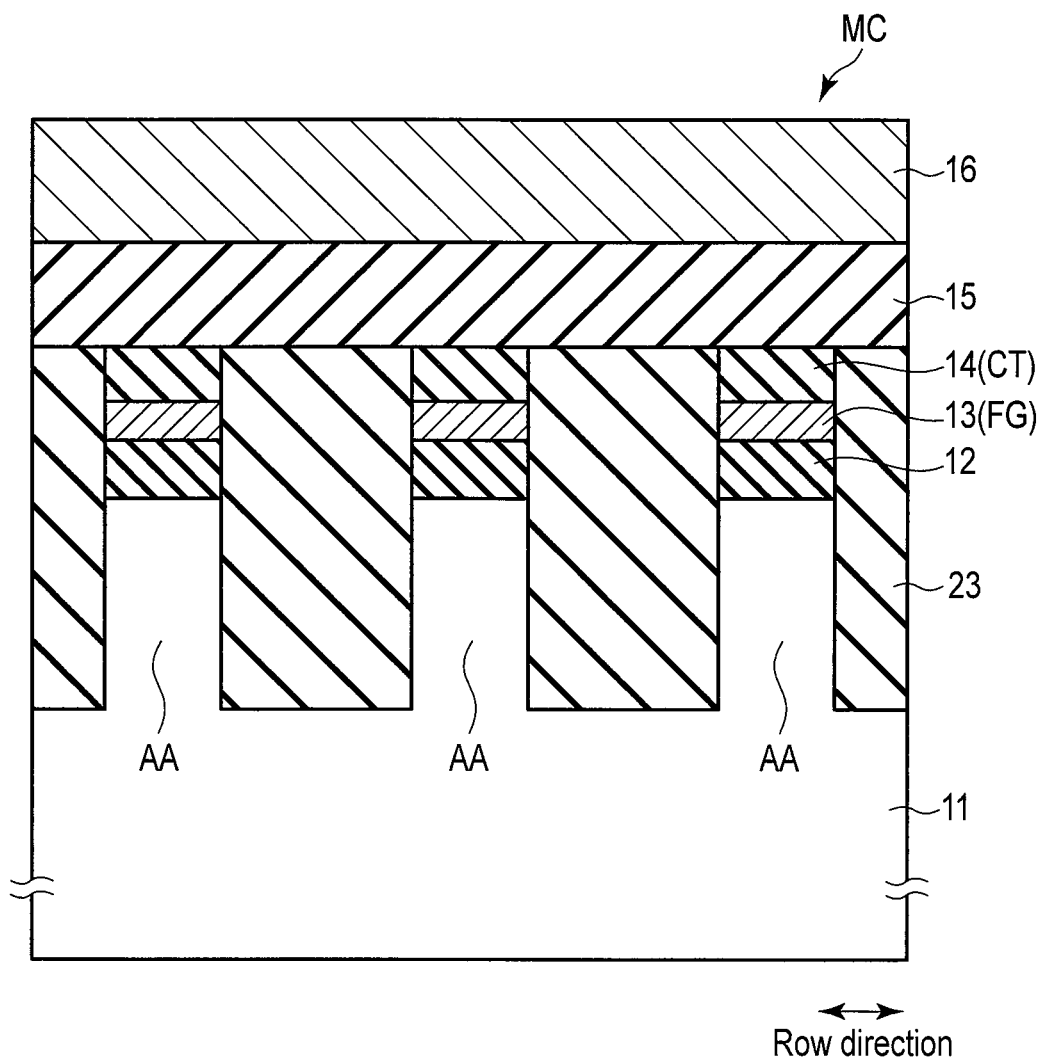
F I G. 2

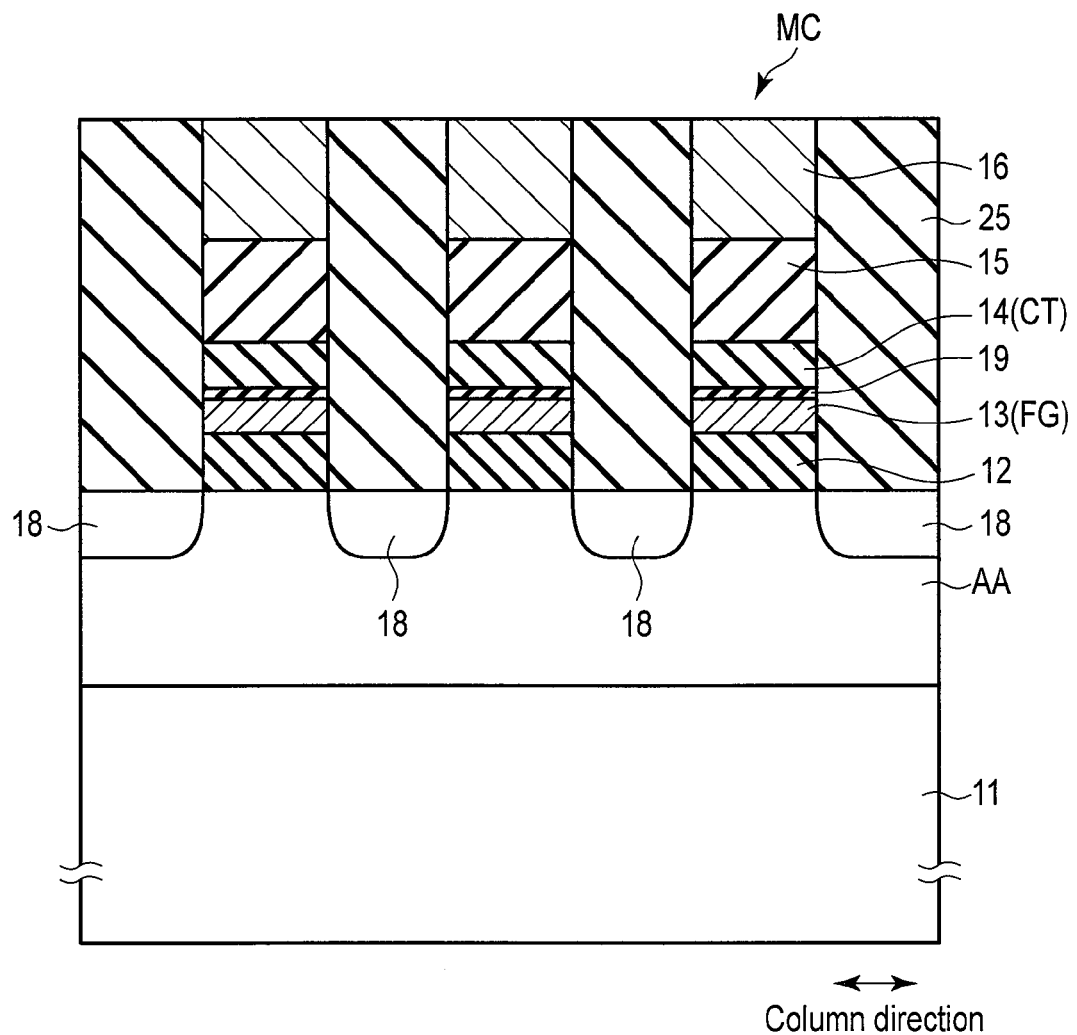
F I G. 5

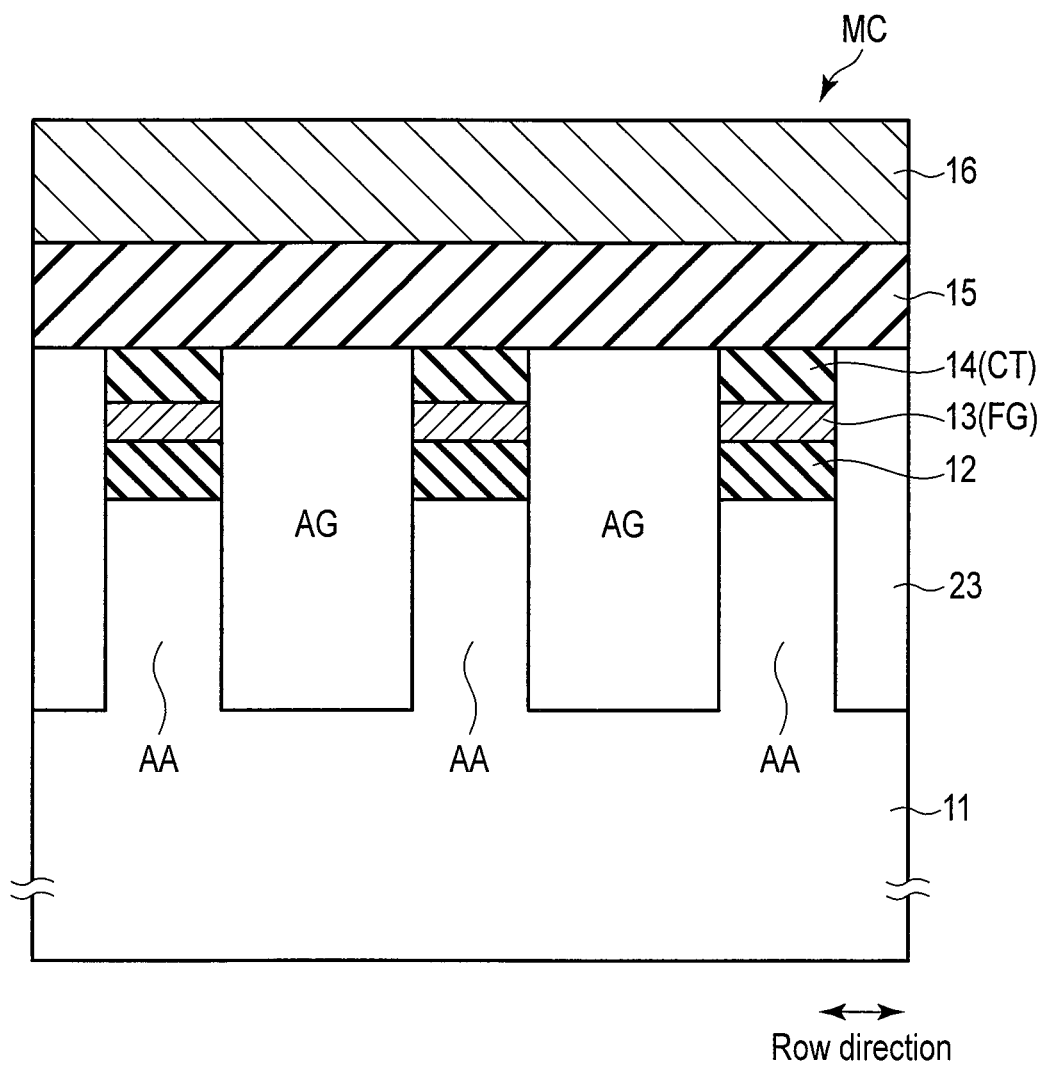
F I G. 6

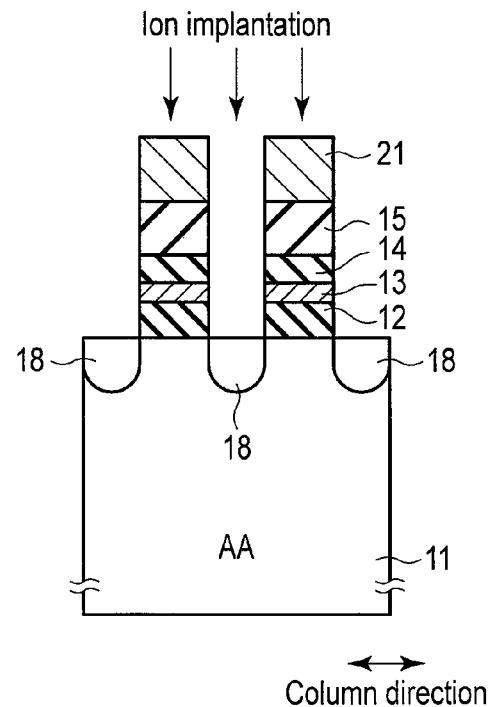
F I G. 14
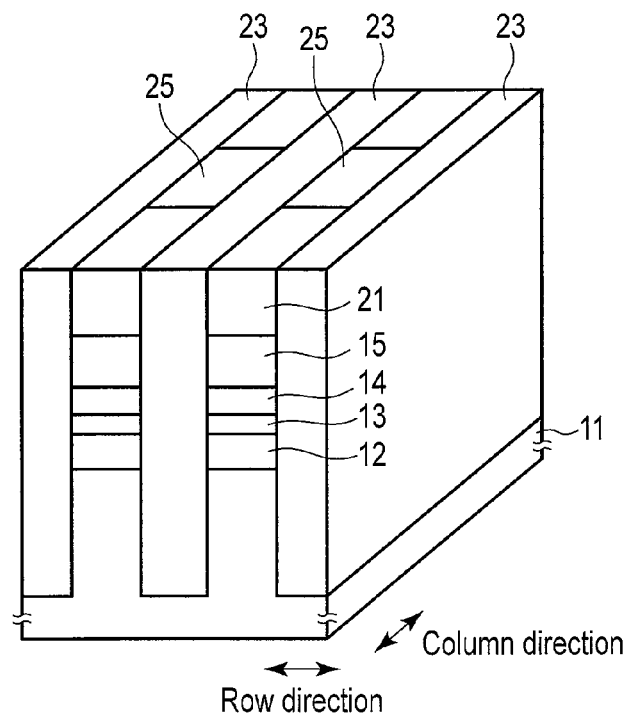
F I G. 15

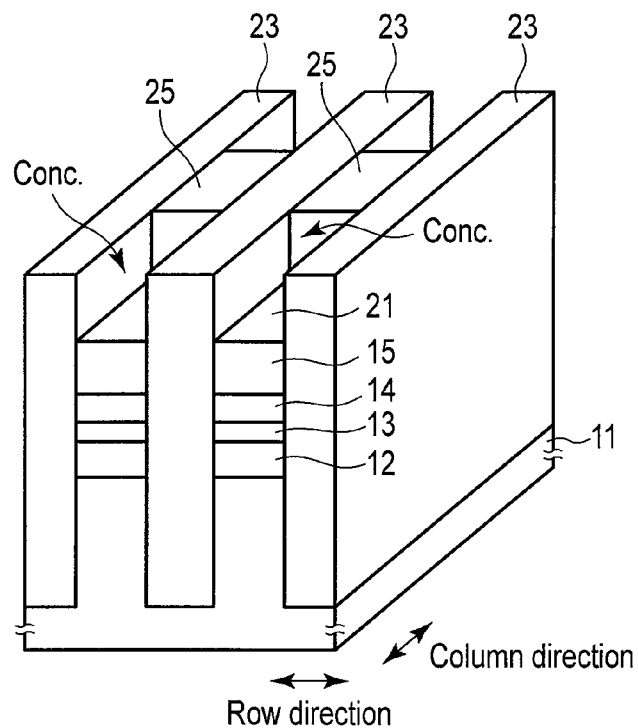
F I G. 16
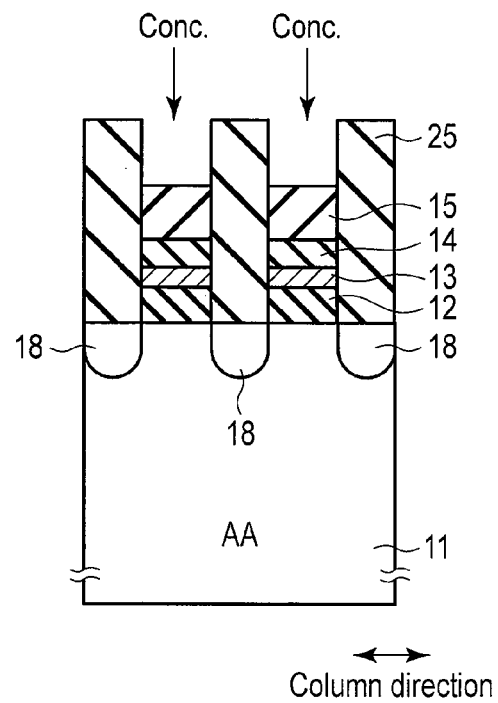
F I G. 17

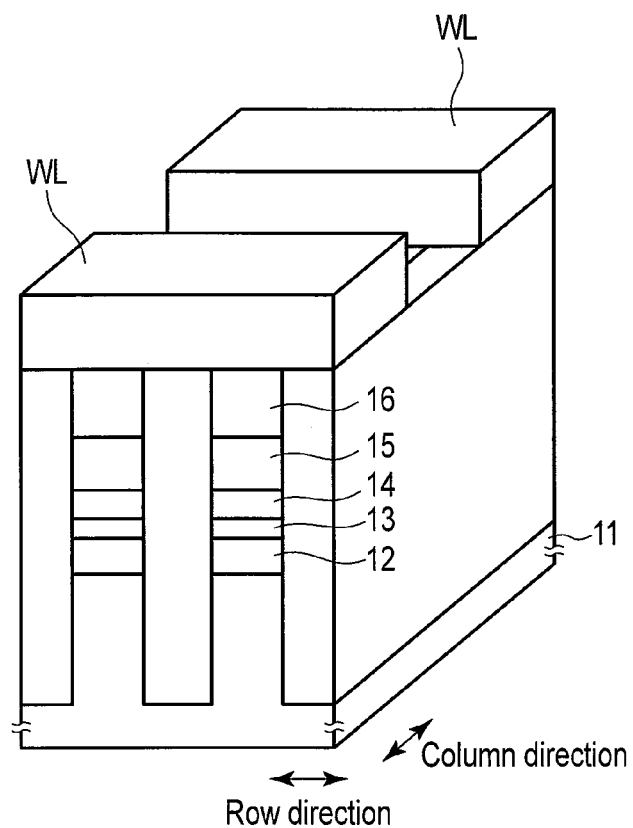
F I G. 20
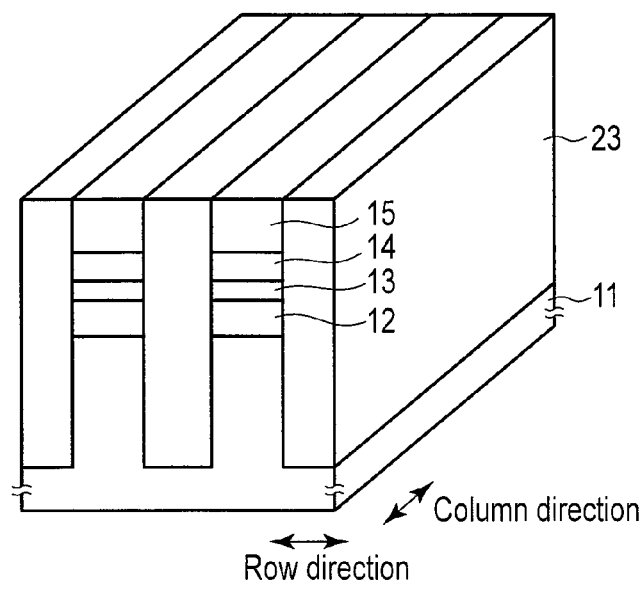
F I G. 21

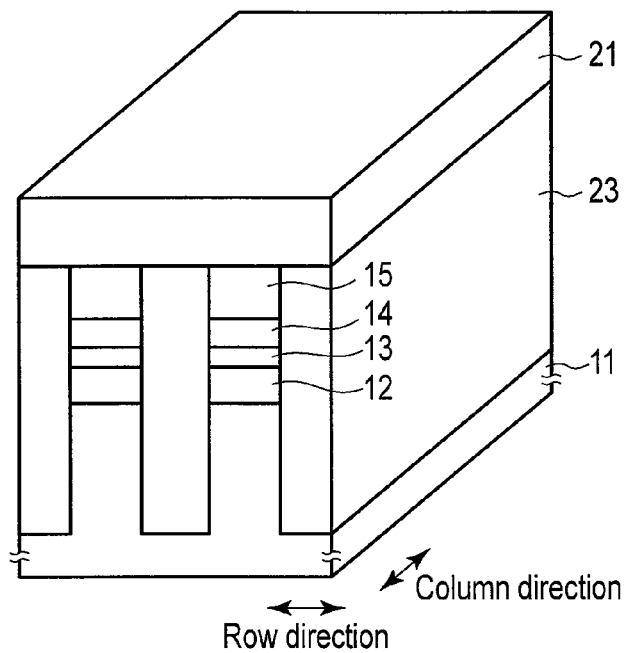
F I G. 2 2
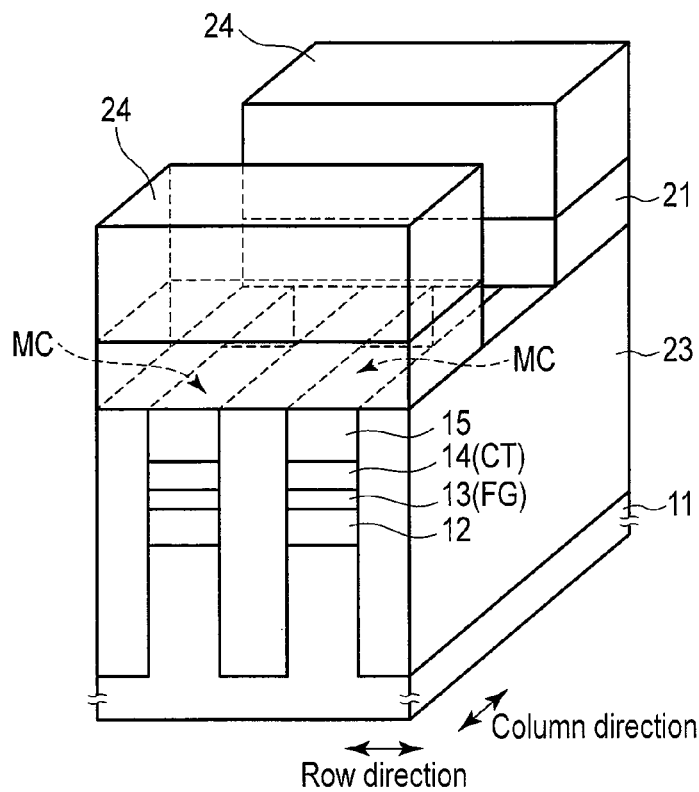
F I G. 2 3

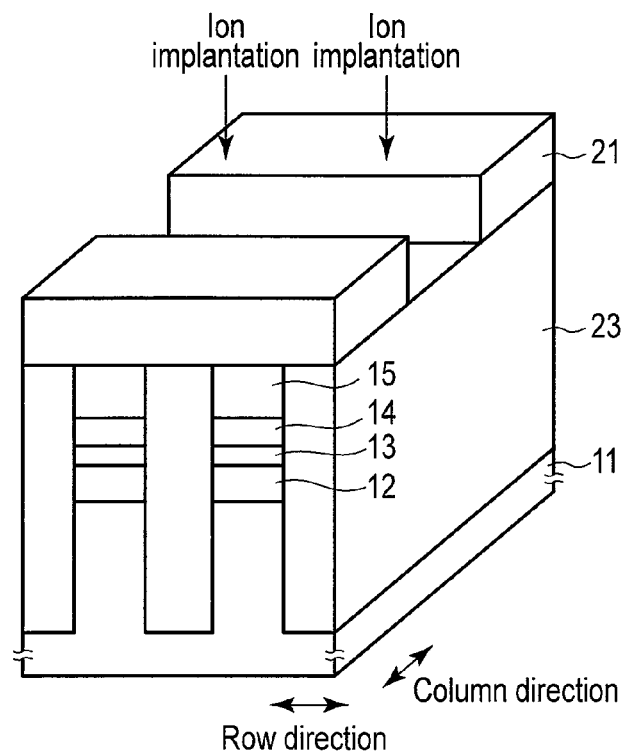
F I G. 24
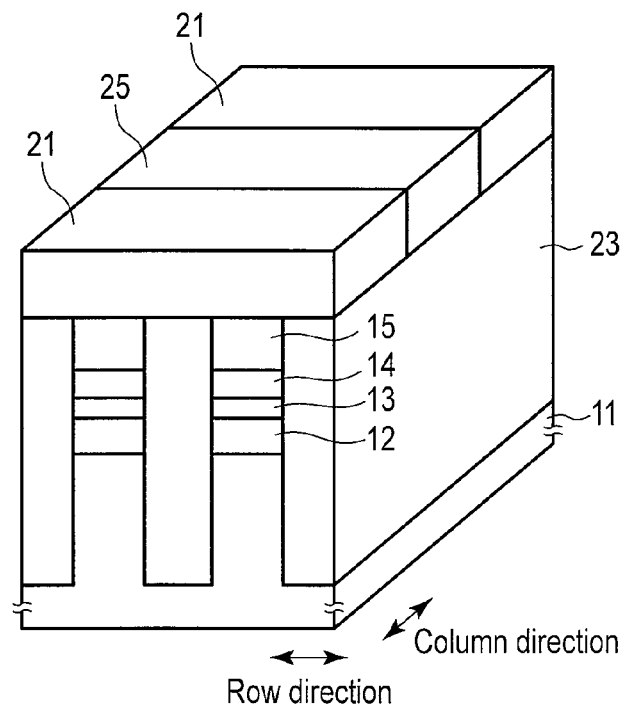
F I G. 25

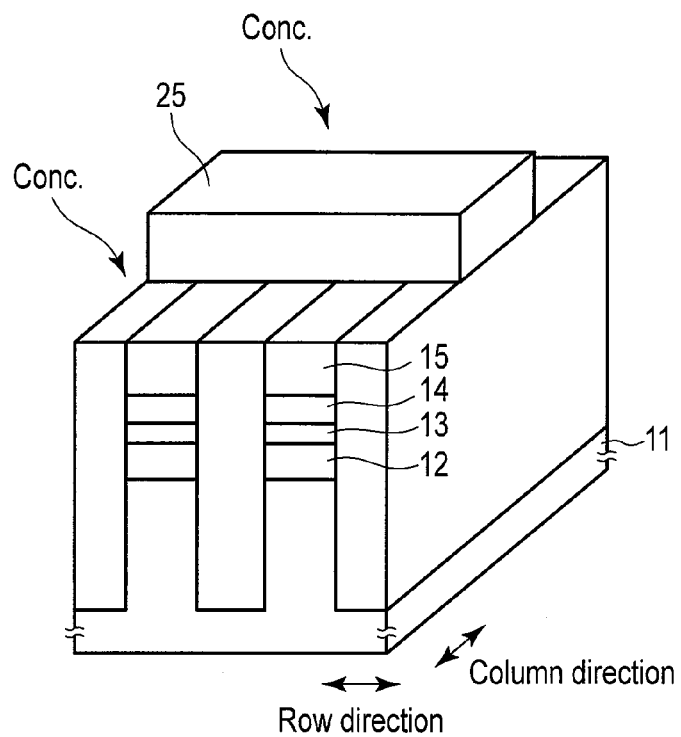
F I G. 26
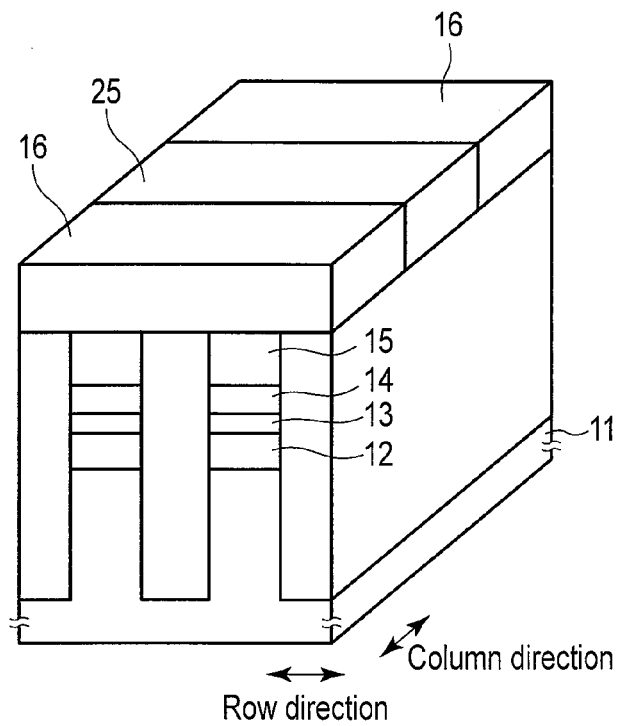
F I G. 27

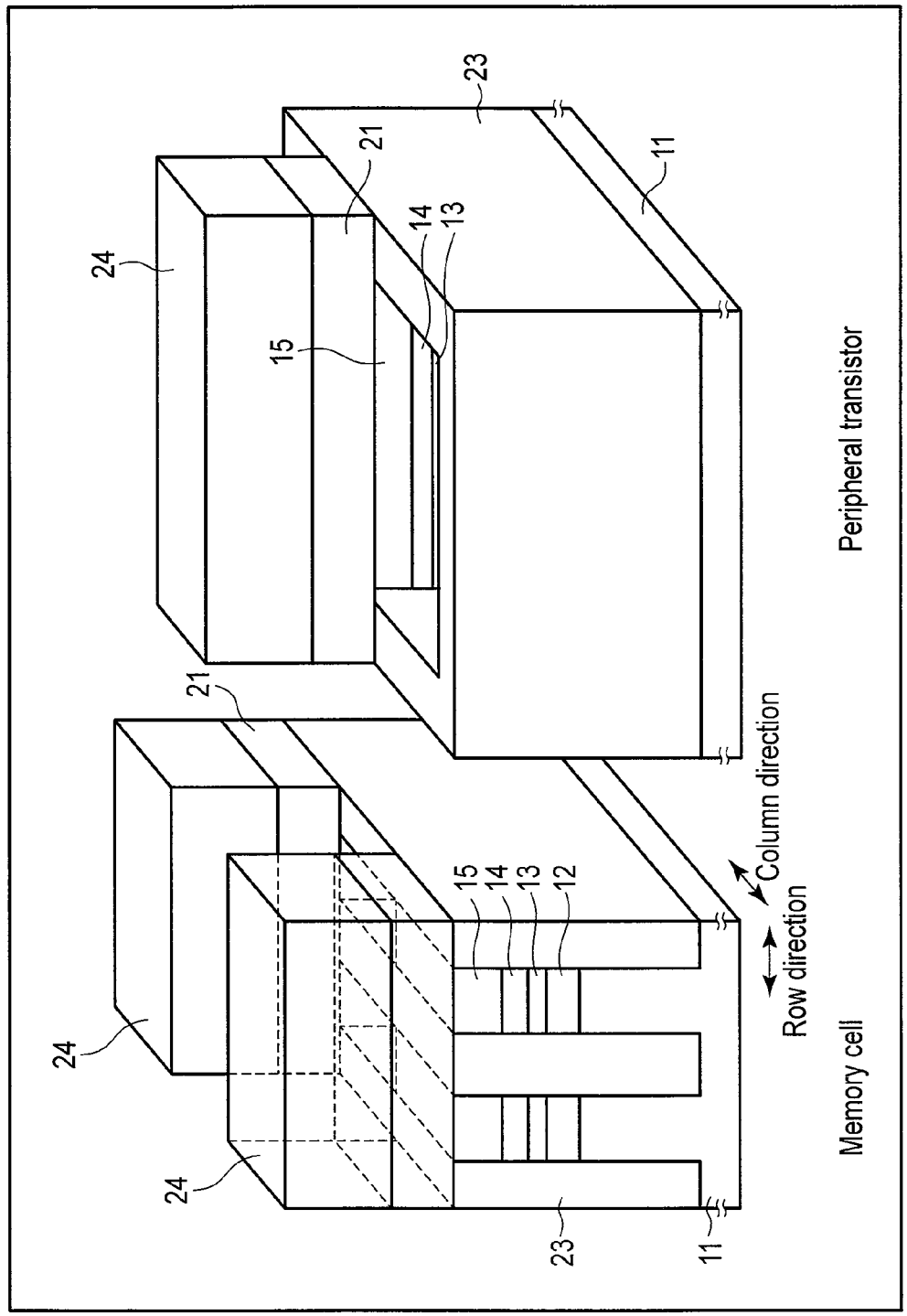
F I G. 30

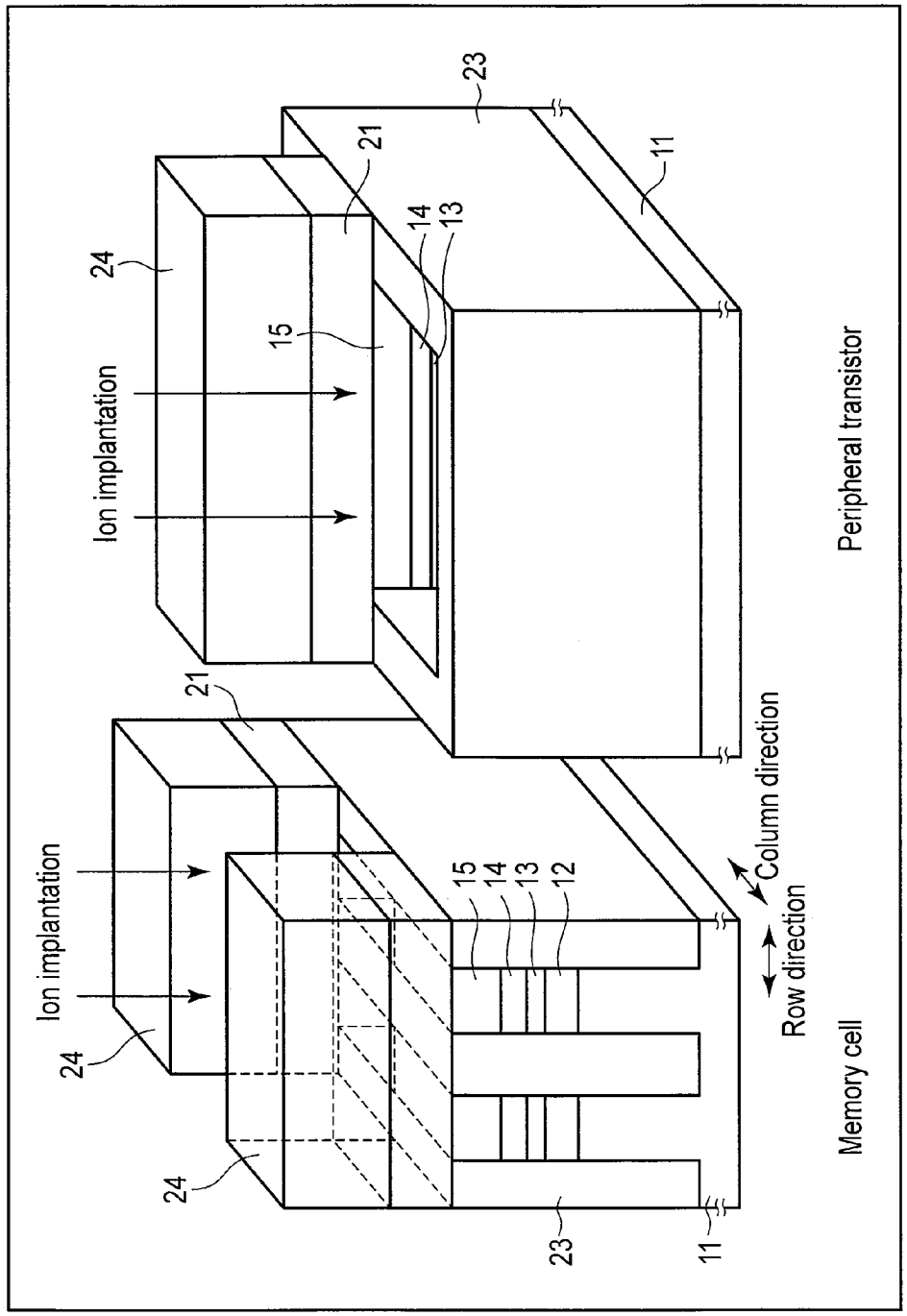
F I G. 31

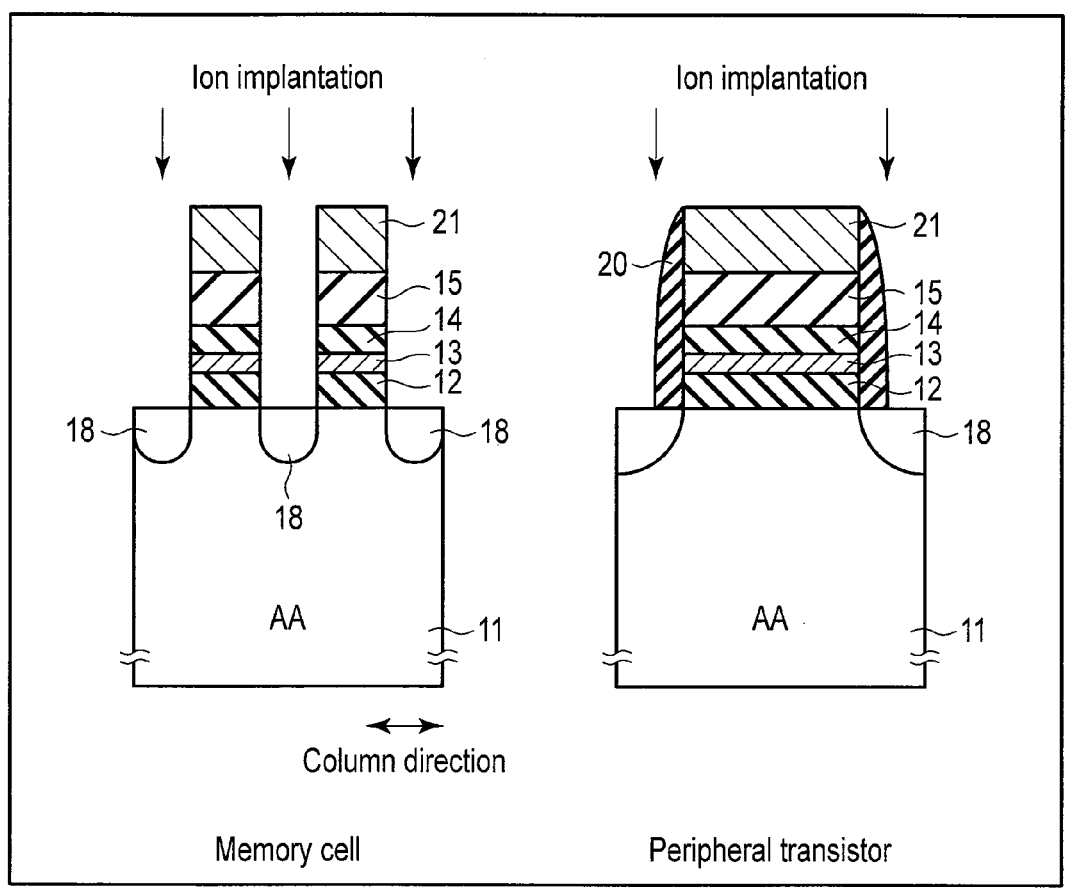
F I G. 3 2

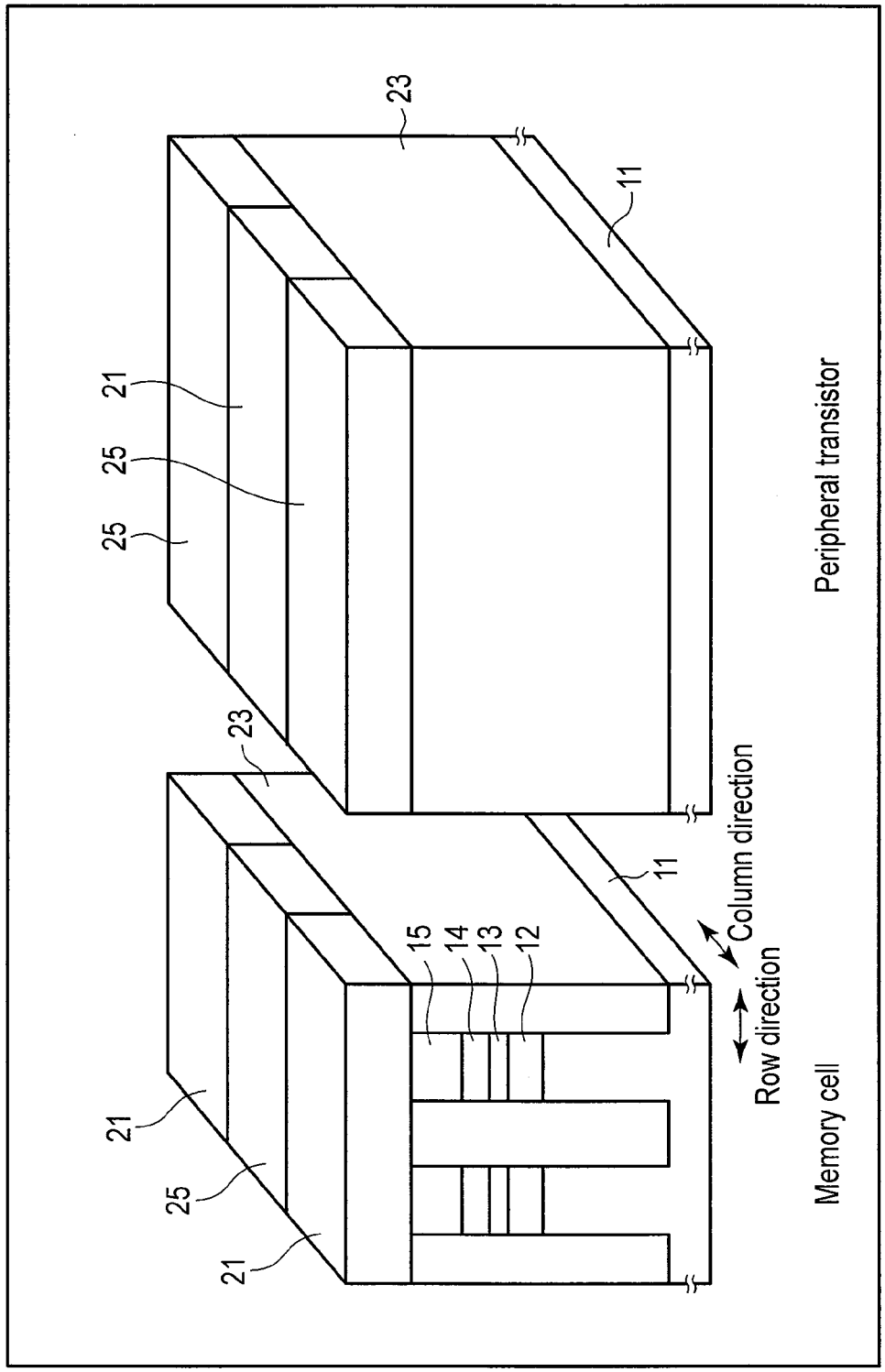
F I G. 33

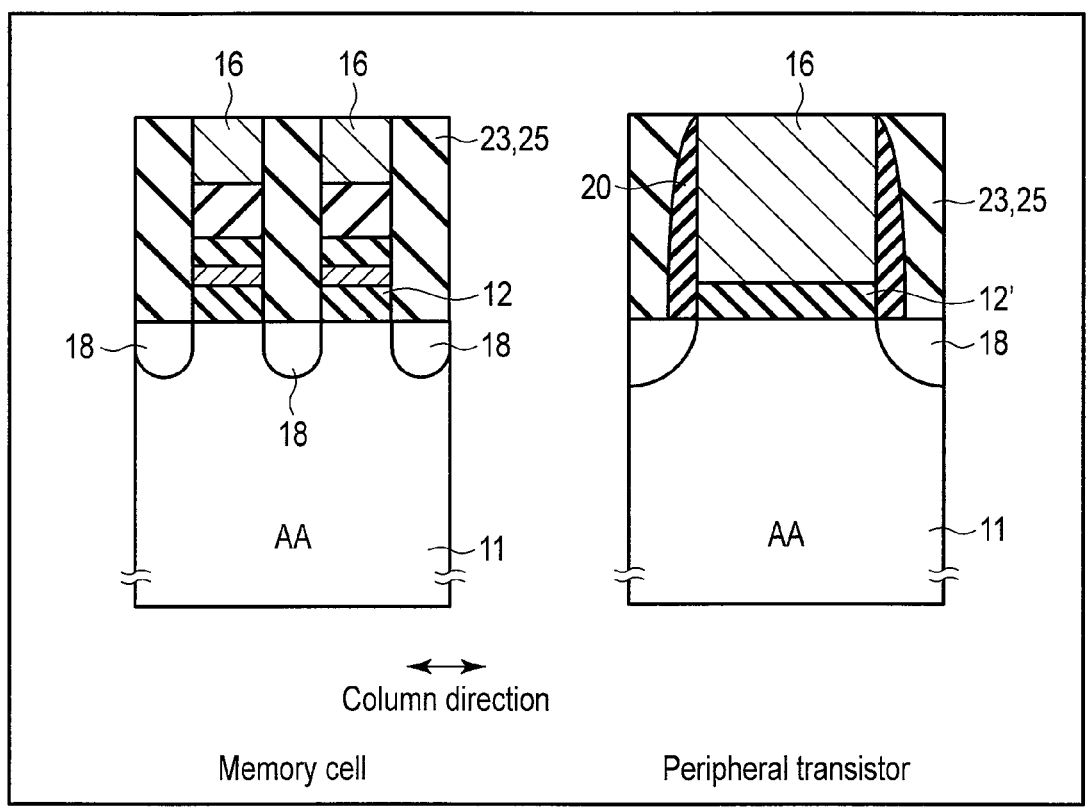
F I G. 41

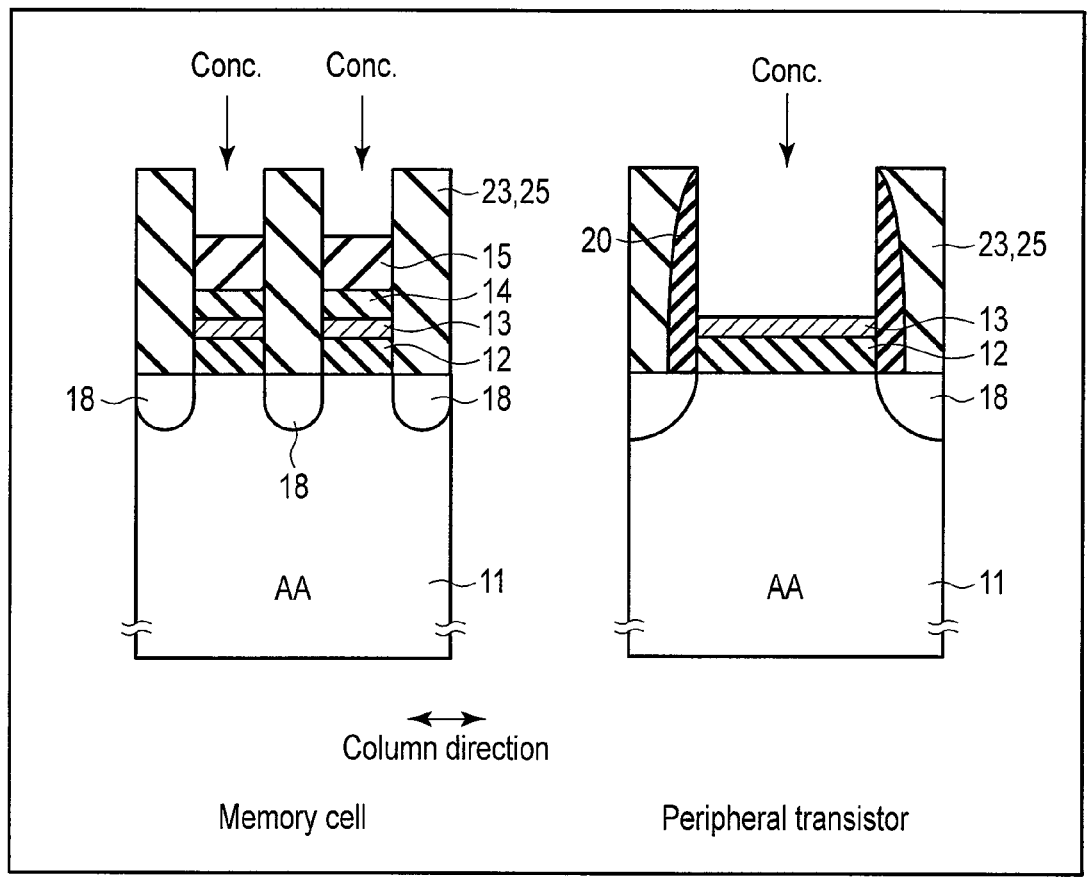
F I G. 4 2

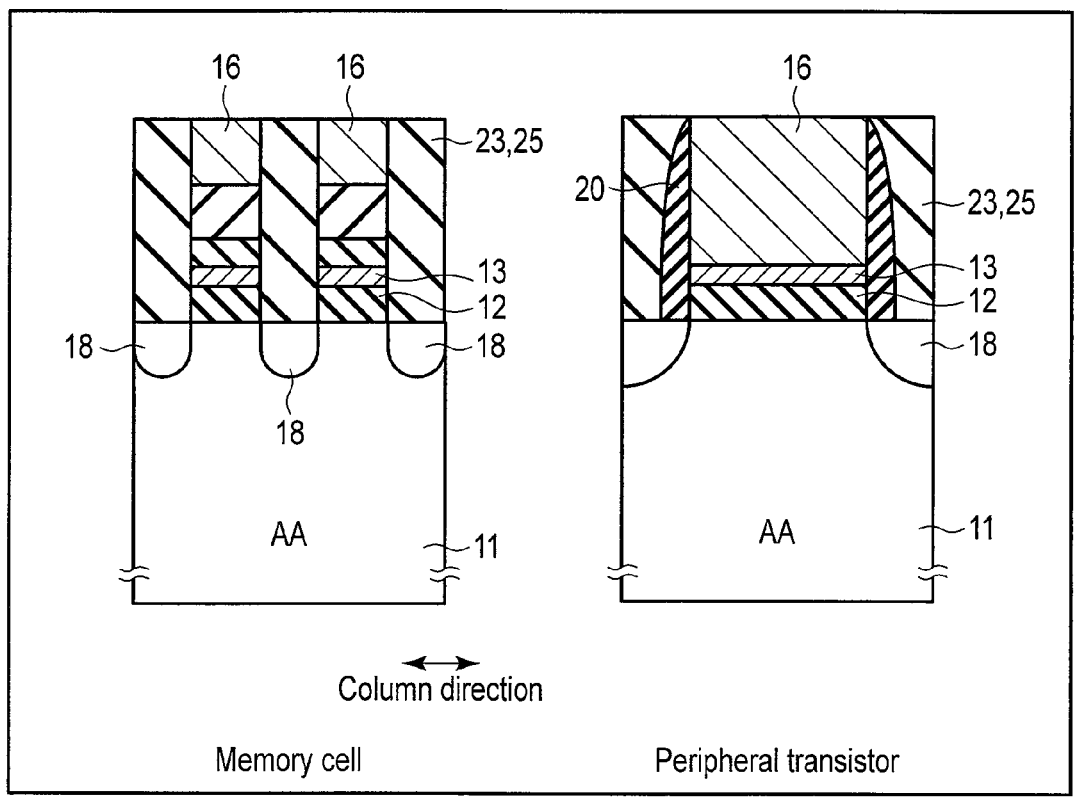
F I G. 4 3

METHOD OF MANUFACTURING NONVOLATILE SEMICONDUCTOR MEMORY DEVICE

CROSS-REFERENCE TO RELATED APPLICATIONS

This application is based upon and claims the benefit of priority from Japanese Patent Application No. 2013-037563, filed Feb. 27, 2013, the entire contents of which are incorporated herein by reference.

FIELD

Embodiments described herein relate generally to a method of manufacturing a' nonvolatile semiconductor memory device.

BACKGROUND

In a nonvolatile semiconductor memory device such as an NAND flash memory, as miniaturization of memory cells advances, a technology of combining a flat cell structure and a hybrid structure has attracted attention in place of a rocket structure having danger such as fall.

The flat cell structure has the advantage that a control gate electrode does not enter a space between charge storage layers arranged in a row direction in which the control gate electrodes (word lines) extend, and hence a half of a pitch (the half pitch) of bit lines extending in a column direction is not restricted.

Moreover, the hybrid structure can store a larger amount of charges in a charge trap layer by a charge storage layer comprising a floating gate layer on a semiconductor substrate side and the charge trap layer on a control gate electrode side. Consequently, the hybrid structure has the advantage that writing/erasing characteristics (a threshold value window) can sufficiently be acquired, even when the memory cells are miniaturized.

However, when the flat cell structure and the hybrid structure are combined, an element in the control gate electrodes diffuses in a high-permittivity insulating layer (a high-k material layer) and the charge storage layer by a heat treatment to activate a diffusion layer formed in the semiconductor substrate. In consequence, there has been the problem that the writing/erasing characteristics deteriorate.

BRIEF DESCRIPTION OF THE DRAWINGS

FIG. 2 is a sectional view along the II-II line of FIG. 1;
FIG. 4 and FIG. 5 are sectional views showing a second example of the array structure;
FIG. 6 and FIG. 7 are sectional views showing a third example of the array structure;
FIG. 9 to FIG. 20 are views showing a manufacturing method according to a first embodiment;
FIG. 21 to FIG. 27 are views showing a manufacturing method according to a second embodiment;
FIG. 28 to FIG. 38 are views showing a manufacturing method according to a third embodiment;
and
FIG. 39 to FIG. 43 are views showing manufacturing methods according to modifications of the third embodiment.

DETAILED DESCRIPTION

In general, according to one embodiment, a method of manufacturing a nonvolatile semiconductor memory device, the method comprising: forming first and second gate patterns each including a structure stacked in order of a first insulating layer, a floating gate layer, a charge trap layer, a second insulating layer and a dummy layer on a semiconductor layer; implanting impurities in the semiconductor layer by an ion implantation using the first and second gate patterns as a mask; forming a third insulating layer on the semiconductor layer, the third insulating layer covering side surfaces of the first and second gate patterns; forming first and second concave portions, the first concave portion formed by removing the dummy layer of the first gate pattern, the second concave portion formed by removing the dummy layer, the second insulating layer, the charge trap layer and the floating gate layer of the second gate pattern; forming a metal layer on the second insulating layer in the first concave portion and on the first insulating layer in the second concave portion; and executing a heat treatment to activate the impurities, before forming the metal layer and after the ion implantation.

Hereinafter, embodiments will be described with reference to the drawings.

1. Array Structure

Figure 1:
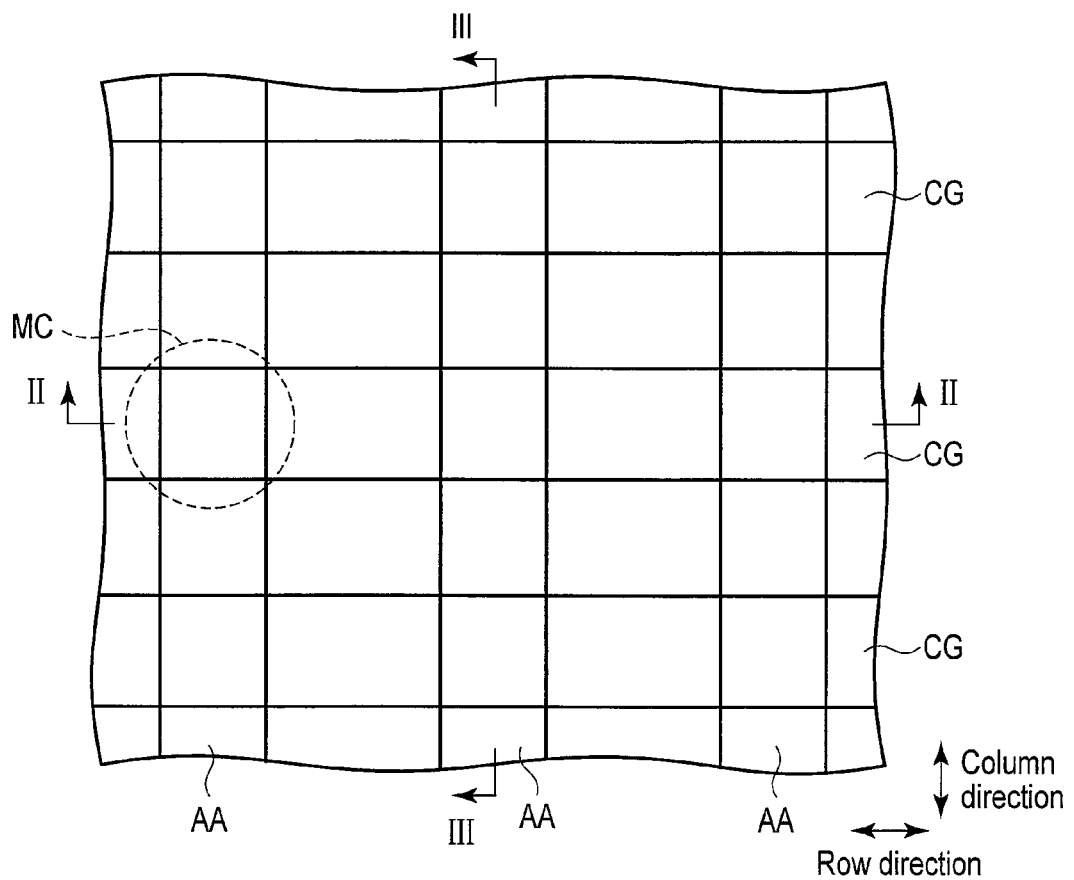
FIG. 1 is a plan view showing a first example of an array structure.
Figure 3:
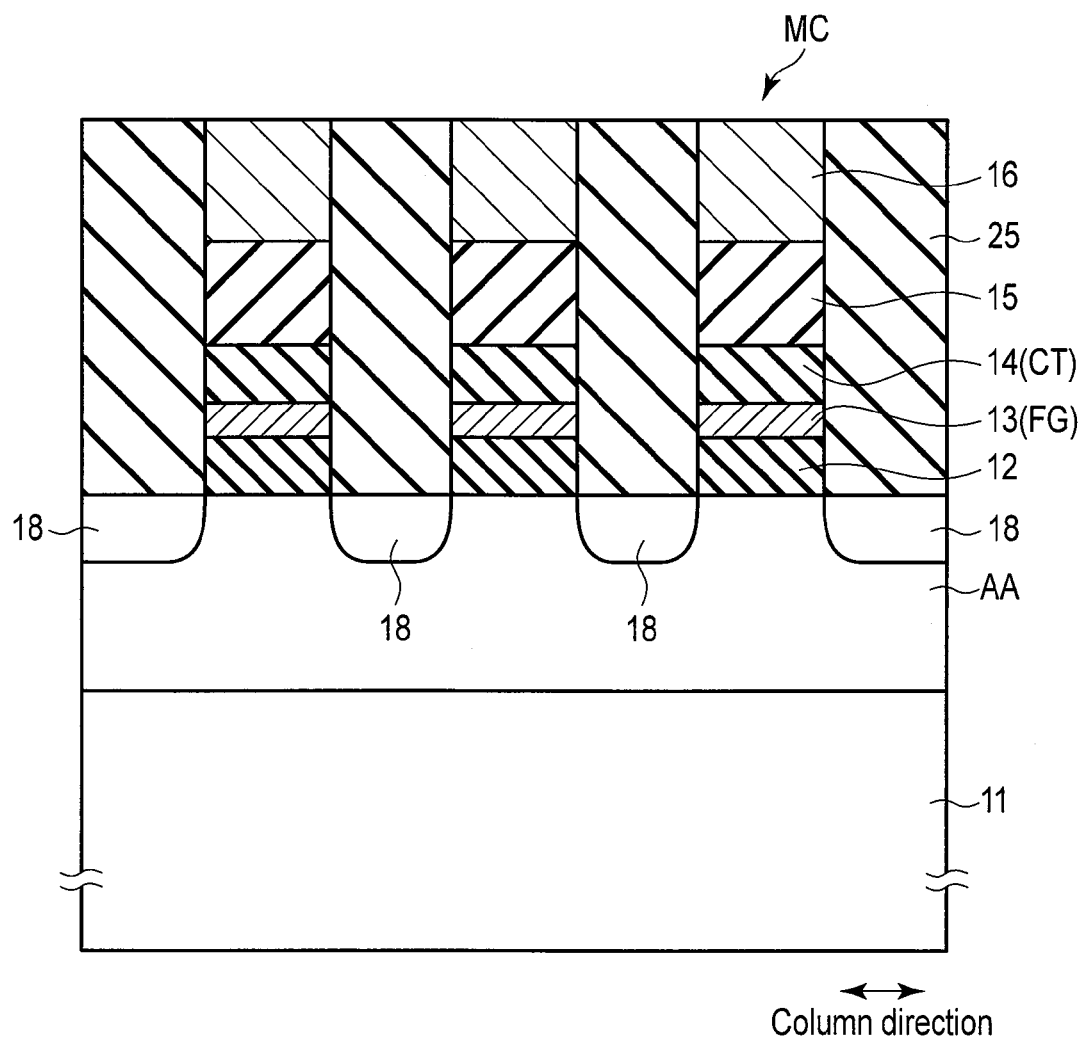
FIG. 3 is a sectional view along the line of FIG. 1.

FIG. 1 to FIG. 3 show a first example of the array structure.
FIG. 1 is a plan view of a memory cell array, FIG. 2 is a sectional view cut along the II-II line of FIG. 1, and FIG. 3 is a sectional view cut along the line of FIG. 1.

This array structure relates to memory cells in which a flat cell structure and a hybrid structure are combined.

Semiconductor substrate (semiconductor layer) 11 is, for example, a silicon substrate. An upper surface of semiconductor substrate 11 has a concavoconvex shape, and convex portions become active areas AAs. Active areas AAs are arranged in a row direction, and extend in a column direction perpendicular to the row direction.

In the present embodiment, active areas AAs constitute a part of semiconductor substrate 11, but the present embodiment is not limited. For example, active areas AAs may be a semiconductor layer such as an epitaxial layer on semiconductor substrate 11.

Memory cells (field effect transistors: FETs) MCs are arranged on each active area AA. Memory cells MCs on one active area AA are connected in series, for example, in the column direction, to constitute a NAND string.

Each memory cell MC comprises first insulating layer (tunnel insulating layer) 12 on active area AA, floating gate layer 13 (FG) on first insulating layer 12, charge trap layer 14 (CT) on floating gate layer 13 (FG), second insulating layer 15 on charge trap layer 14 (CT), and control gate electrode 16 on second insulating layer 15. Control gate electrode 16 functions as a word line, and extends in the row direction.

In active area AA between gate patterns of these memory cells MCs, impurity region 18 is disposed. Moreover, a space between memory cells MCs is filled with third insulating layers 23 and 25.

First insulating layer 12 is, for example, a silicon oxide layer, and formed by oxidizing an upper surface of fin-type active area AA.

Floating gate layer 13 (FG) comprises a conductive layer in an electrically floating state, for example, a conductive polysilicon layer including impurities. Floating gate layer 13 (FG) may have a metal layer, or a stacked structure of a polysilicon layer and the metal layer.

Charge trap layer 14 (CT) comprises an insulating layer with a function of trapping charges, for example, SiN, SiON, $Al_2O_3$, HfO or the like.

Second insulating layer 15 comprises, for example, a high-permittivity insulating layer (a high-k material layer) having a permittivity higher than a silicon oxide layer, to enhance a coupling ratio of memory cells MCs. Examples of the high-permittivity insulating layer include metal oxides such as $Al_2O_3$, $ZrO_2$, HfAlO, $LaAlo_3$ (LAO) and LaAlSiO (LASO), and stacked structures of the oxides. Moreover, the high-permittivity insulating layer may be a stacked structure of the silicon oxide layer and a silicon nitride layer, for example, ONO.

Control gate electrode 16 comprises a metal layer. Here, the metal layer includes a metal compound layer (e.g., a metal silicide layer or the like). Control gate electrode 16 includes, for example, a titanium (Ti) layer, a tungsten (W) layer, a tantalum (Ta) layer, a titanium silicide layer, a tungsten silicide layer, a tantalum silicide layer or the like.

Figure 4:
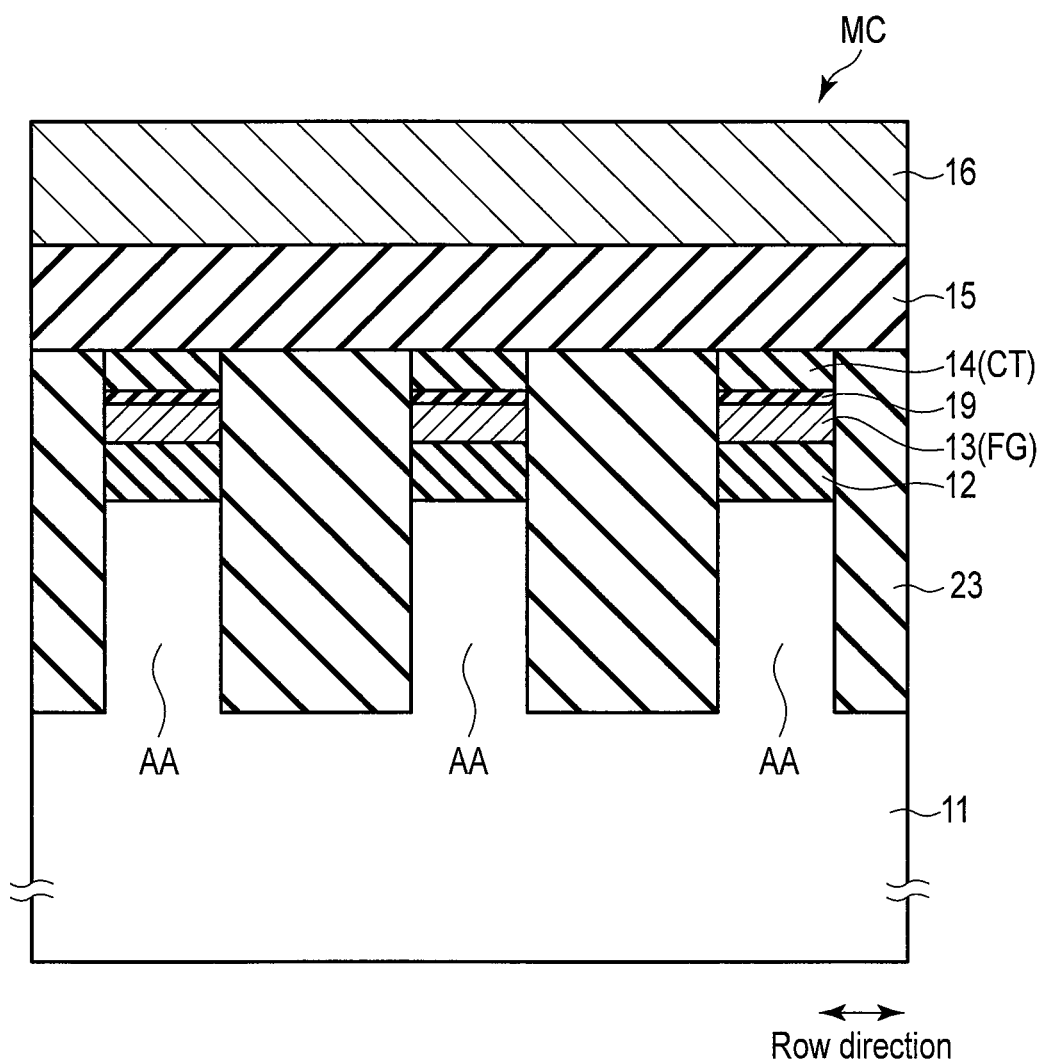

It is to be noted that as shown in FIG. 4 and FIG. 5, ultrathin insulating layer (e.g., silicon nitride layer) 19 with a thickness of 10 nm or less may be interposed between floating gate layer 13 (FG) and charge trap layer 14 (CT). FIG. 4 and FIG. 5 correspond to FIG. 2 and FIG. 3.

Figure 7:
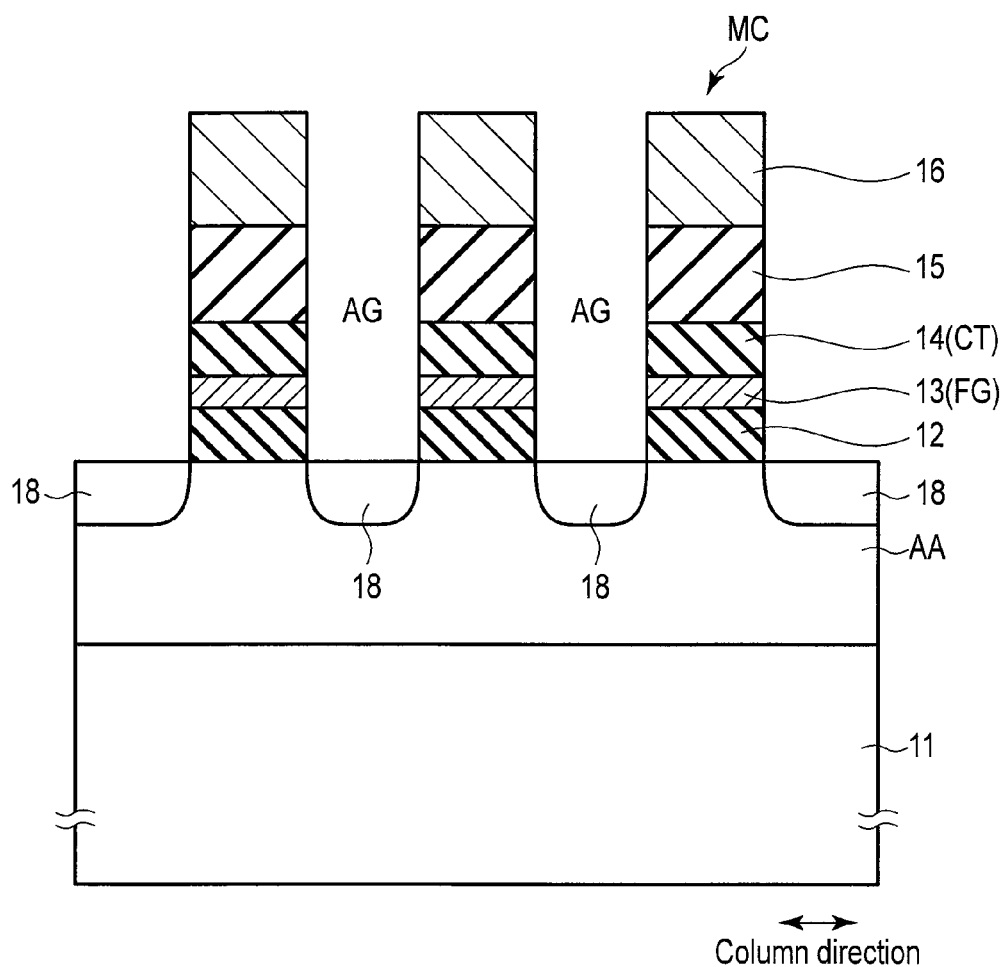

Moreover, as shown in FIG. 6 and FIG. 7, a space between memory cells MCs may be air gap AG. FIG. 6 and FIG. 7 correspond to FIG. 2 and FIG. 3.

Figure 8A:
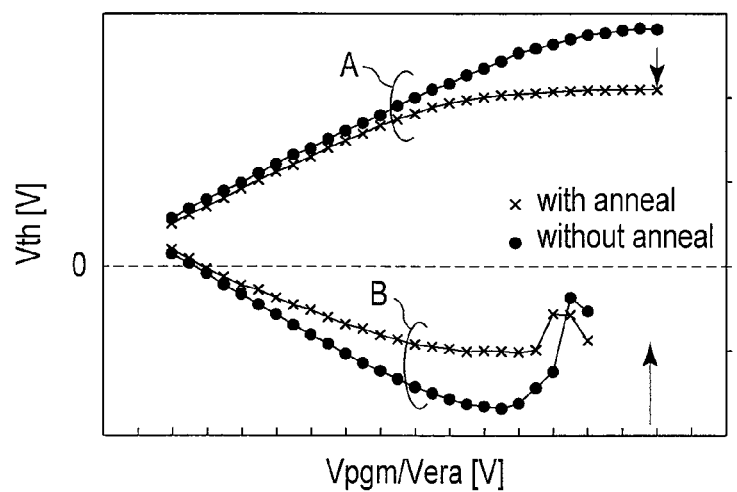
FIG. 8A is a diagram showing reduction of a threshold value window by annealing.
Figure 8B:
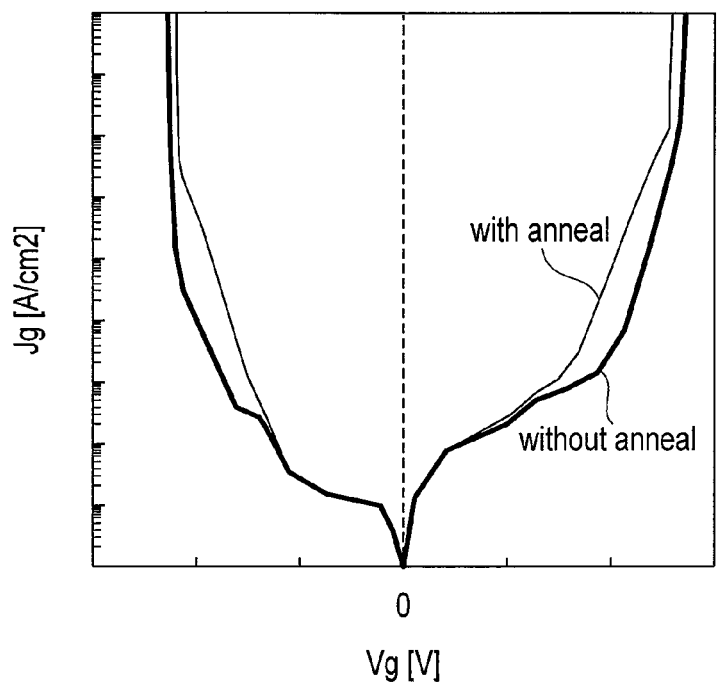
FIG. 8B is a diagram showing increase of a leak current by the annealing.

In the above-mentioned memory cells in which the flat cell structure and the hybrid structure are combined, writing/erasing characteristics of memory cells MCs deteriorate due to a heat treatment to activate impurity regions 18 formed in semiconductor substrate 11, for example, as shown in FIG. 8A and FIG. 8B.

That is, according to FIG. 8A, it is seen that execution of annealing (the heat treatment) to activate impurity regions 18 narrows a difference (a threshold value window) between threshold value Vth [V] of memory cell MC subjected to writing at writing voltage Vpgm [V] and threshold value Vth [V] of memory cell MC subjected to erasing at erasing voltage Vera [V].

Moreover, according to FIG. 8B, it is seen that leak current Jg [$A/cm^2$] to gate voltage Vg [V] of control gate electrode 16 is larger at a time when the annealing to activate impurity regions 18 is executed than a time when the annealing to activate impurity regions 18 is not executed. Additionally, a voltage of semiconductor substrate 11 at the application of gate voltage Vg is 0 V, and leak current Jg is a leak current between semiconductor substrate 11 and control gate electrode 16.

As a result of verification of a cause for the deterioration of the writing/erasing characteristics of memory cells MC, it has been found that an element in control gate electrodes 16 diffuses in second insulating layer 15 and charge trap layer 14 (CT) due to the heat treatment to activate impurity regions 18. Therefore, hereinafter, there will be suggested a manufacturing method of forming control gate electrodes 16 after the heat treatment to activate impurity regions 18.

Moreover, in such a manufacturing method, there will be suggested a technology of achieving consistency in a process between memory cell MC and transistor (peripheral transistor) Tperi in a peripheral circuit.

2. Manufacturing Method

A manufacturing method of the array structure of FIG. 1 to FIG. 7 will be described.

However, hereinafter, a structure of the first example of FIG. 1 to FIG. 3 will mainly be described. It is possible to form a second example of FIG. 4 and FIG. 5 and a third example of FIG. 6 and FIG. 7 only by adapting the following manufacturing method a little, and hence this respect will suitably be described.

(1) First Embodiment

Figure 9:
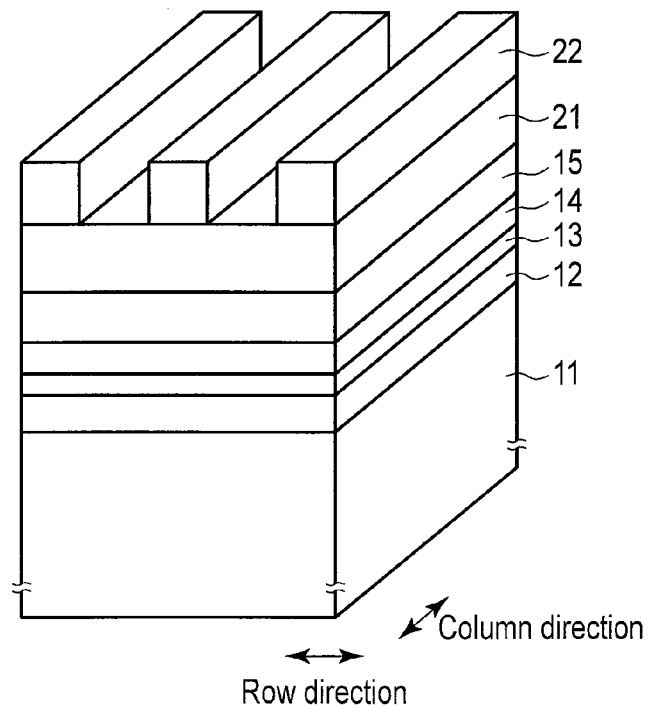

First, as shown in FIG. 9, on semiconductor substrate 11, there are sequentially formed first insulating layer 12, floating gate layer 13, charge trap layer 14, second insulating layer 15, and dummy layer 21. Dummy layer 21 is, for example, a polysilicon layer.

It is to be noted that when a process described later is executed after forming an ultrathin insulating layer between floating gate layer 13 and charge trap layer 14, the array structure shown in FIG. 4 and FIG. 5 can be obtained.

Moreover, photoresist layer 22 is formed on dummy layer 21 by a photo engraving process (PEP). Photoresist layer 22 has line and space patterns arranged at a predetermined pitch in a row direction and extending in a column direction.

Then, dummy layer 21, second insulating layer 15, charge trap layer 14, floating gate layer 13, first insulating layer 12 and semiconductor substrate 11 are patterned by reactive ion etching (RIE) using photoresist layer 22 as a mask. In this patterning, wet etching may be used in place of the RIE.

Figure 10:
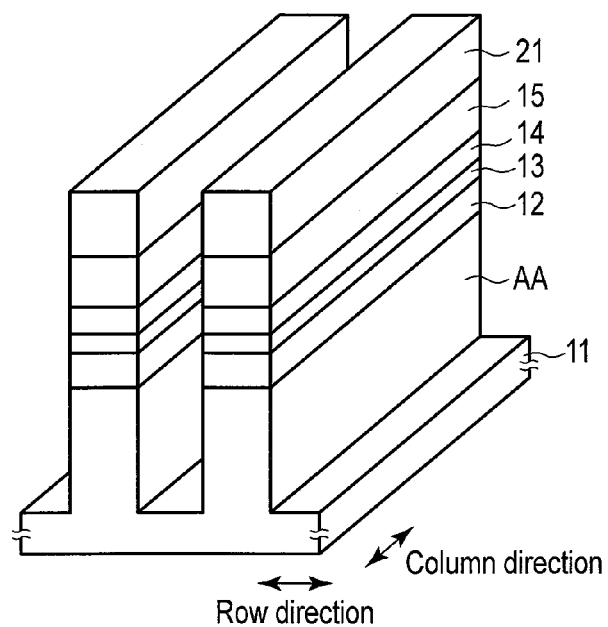

Afterward, when photoresist layer 22 is removed, the line and space patterns (gate patterns) arranged at the predetermined pitch in the row direction and extending in the column direction are formed as shown in FIG. 10. Furthermore, an upper surface of semiconductor substrate 11 has concaves and convexes, and convex portions of semiconductor substrate 11 become active areas AAs.

It is to be noted that photoresist layer 22 may be replaced with a hard mask layer.

Figure 11:
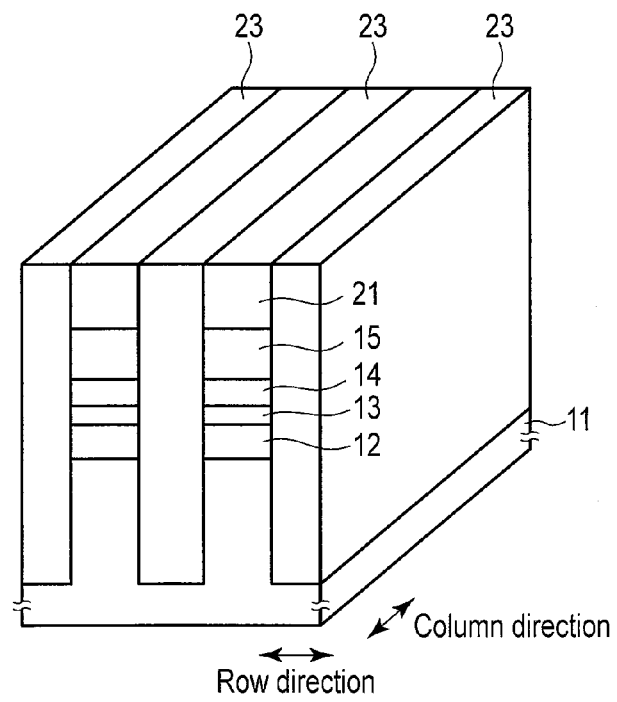

Next, as shown in FIG. 11, spaces (concave portions) of the line and space patterns are filled with third insulating layer 23. For example, third insulating layer 23 is formed so as to cover the line and space patterns by a sputtering method, and then left only in the spaces of the line and space patterns by chemical mechanical polishing (CMP).

Figure 12:
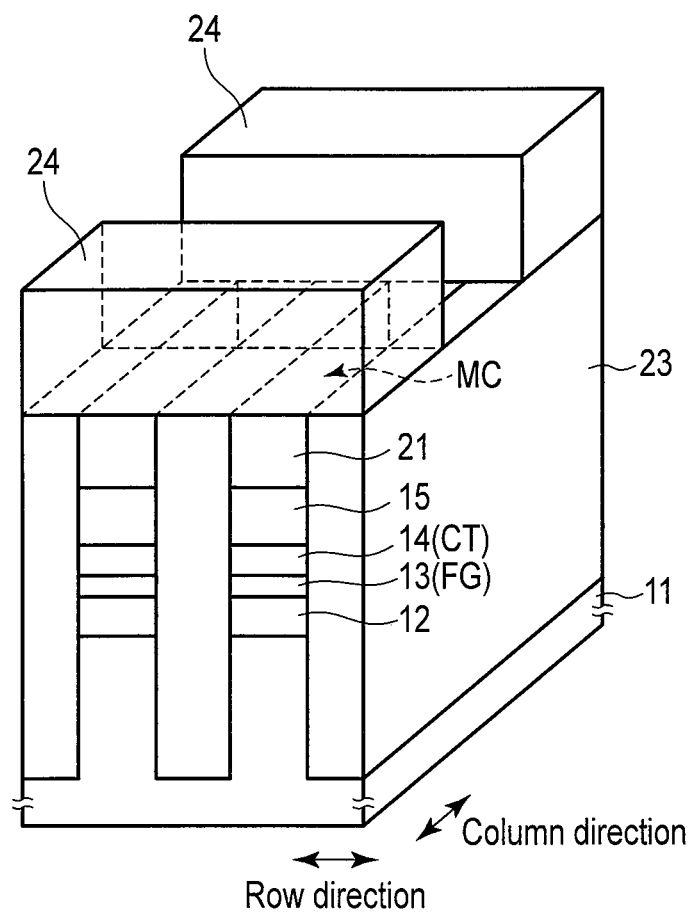

Next, as shown in FIG. 12, photoresist layer 24 is formed on dummy layer 21 and third insulating layer 23 by the PEP. Photoresist layer 24 has line and space patterns arranged at a predetermined pitch in the column direction and extending in the row direction.

Then, dummy layer 21, second insulating layer 15, charge trap layer 14, floating gate layer 13 and first insulating layer 12 are patterned by the RIE using photoresist layer 24 as a mask. In this patterning, wet etching may be used in place of the RIE.

In consequence, floating gate layer 13 (FG) and charge trap layer 14 (CT) of memory cells MCs are separated from each other.

Afterward, photoresist layer 24 is removed.

It is to be noted that photoresist layer 24 may be replaced with a hard mask layer.

Figure 13:
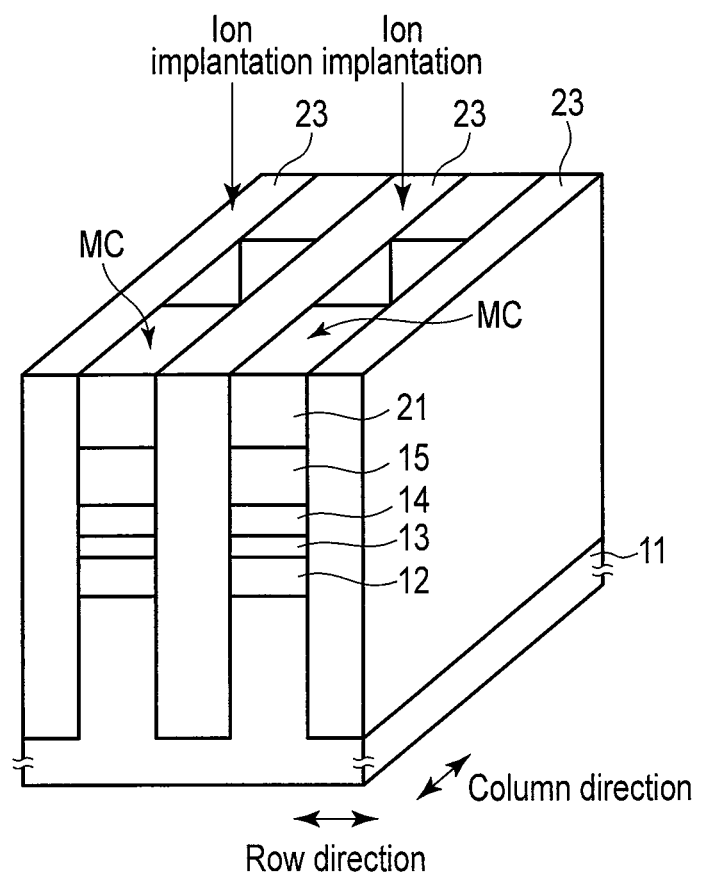

Next, as shown in FIG. 13 and FIG. 14, impurity region 18 is formed in semiconductor substrate (active area AA) 11 in a space between memory cells MCs arranged in the column direction by an ion implantation.

Next, as shown in FIG. 15, the space between memory cells MCs arranged in the column direction is filled with third insulating layer 25. For example, third insulating layer 25 is formed so as to cover memory cells MCs by the sputtering method, and then left only in the space between memory cells MCs arranged in the column direction by the CMP.

It is to be noted that third insulating layers 23 and 25 are preferably made of the same material.

Afterward, when dummy layer 21 is selectively removed, concave portions Conc. are formed on second insulating layer 15 of memory cells MCs as shown in FIG. 16 and FIG. 17.

Figure 18:
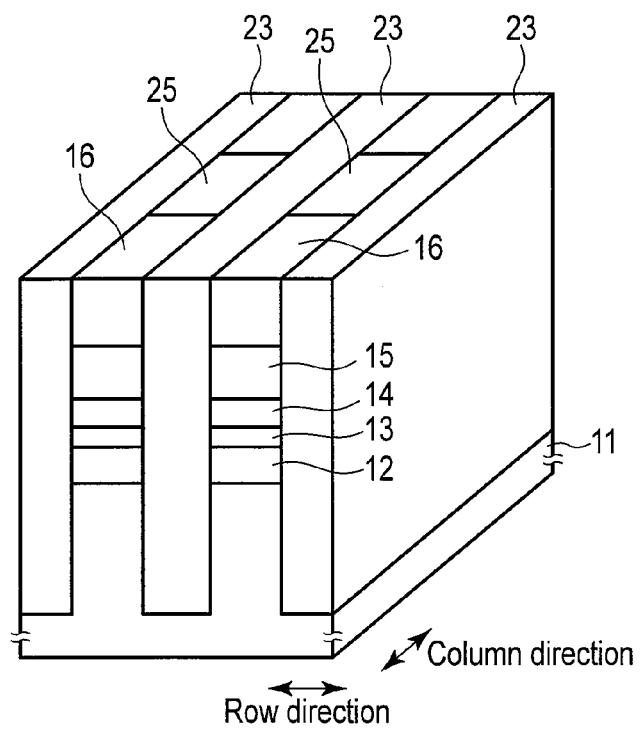
Figure 19:
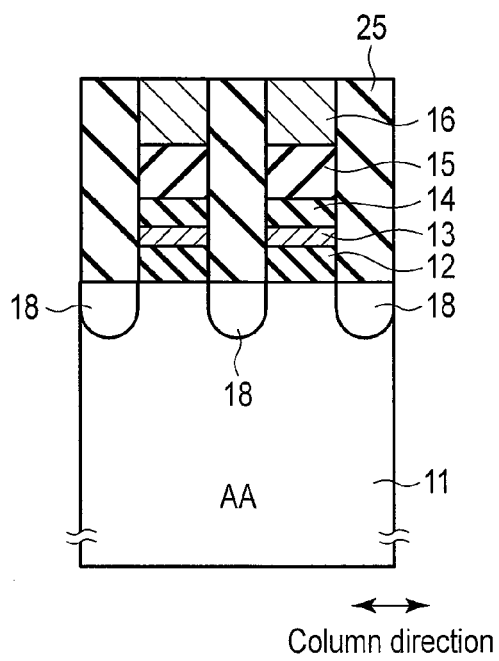

Moreover, when concave portions Conc. are filled with a metal layer, control gate electrodes 16 are formed as shown in FIG. 18 and FIG. 19, to form the array structure of FIG. 1 to FIG. 3. For example, control gate electrodes 16 are formed so as to cover memory cells MCs by the sputtering method, and then left only in concave portions Conc. on second insulating layer 15 of memory cells MCs by the CMP.

Here, the heat treatment (the annealing) to activate the impurities in impurity regions 18 is executed, before forming control gate electrode 16 as the metal layer and after the ion implantation to form impurity regions 18.

Finally, as shown in FIG. 20, there are formed word lines WLs connected to control gate electrodes 16 of memory cells MCs arranged in the row direction and extending in the row direction.

It is to be noted that afterward, when third insulating layers 23 and 25 are selectively removed, the array structure of FIG. 6 and FIG. 7 is formed.

(2) Second Embodiment

First, as shown in FIG. 21, on semiconductor substrate 11, there are sequentially formed first insulating layer 12, floating gate layer 13, charge trap layer 14, and second insulating layer 15. It is to be noted that when an ultrathin insulating layer is formed between floating gate layer 13 and charge trap layer 14 and then a process described later is executed, the array structure shown in FIG. 4 and FIG. 5 can be obtained.

Moreover, a photoresist layer is formed on second insulating layer 15 by a PEP. The photoresist layer has line and space patterns arranged at a predetermined pitch in a row direction and extending in a column direction.

Then, second insulating layer 15, charge trap layer 14, floating gate layer 13, first insulating layer 12 and semiconductor substrate 11 are patterned by RIE using this photoresist layer as a mask. In this patterning, wet etching may be used in place of the RIE.

Afterward, when the photoresist layer is removed, the line and space patterns (gate patterns) arranged at the predetermined pitch in the row direction and extending in the column direction are formed. Furthermore, an upper surface of semiconductor substrate 11 has concaves and convexes, and convex portions of semiconductor substrate 11 become active areas AAs.

It is to be noted that the photoresist layer may be replaced with a hard mask layer.

Next, spaces (concave portions) of the line and space patterns are filled with third insulating layer 23. For example, third insulating layer 23 is formed so as to cover the line and space patterns by a sputtering method, and then left only in the spaces of the line and space patterns by CMP.

Next, as shown in FIG. 22, dummy layer 21 is formed on second insulating layer 15 and third insulating layer 23. Dummy layer 21 is, for example, a polysilicon layer.

Next, as shown in FIG. 23, photoresist layer 24 is formed on dummy layer 21 by the PEP. Photoresist layer 24 has line and space patterns arranged at a predetermined pitch in the column direction and extending in the row direction.

Then, dummy layer 21, second insulating layer 15, charge trap layer 14, floating gate layer 13 and first insulating layer 12 are patterned by the RIE using photoresist layer 24 as a mask. In this patterning, wet etching may be used in place of the RIE.

In consequence, floating gate layer 13 (FG) and charge trap layer 14 (CT) of memory cells MCs are separated from each other.

Afterward, photoresist layer 24 is removed.

It is to be noted that photoresist layer 24 may be replaced with a hard mask layer.

Next, as shown in FIG. 24, when impurities are implanted in semiconductor substrate (active area AA) 11 in a space between memory cells MCs arranged in the column direction by an ion implantation, impurity regions 18 are formed in semiconductor substrate 11, for example, as shown in FIG. 14.

Next, as shown in FIG. 25, the space between memory cells MCs arranged in the column direction is filled with third insulating layer 25. For example, third insulating layer 25 is formed so as to cover memory cells MCs by the sputtering method, and then left only in the space between memory cells MCs arranged in the column direction by the CMP.

It is to be noted that third insulating layers 23 and 25 are preferably made of the same material.

Afterward, when dummy layer 21 is selectively removed, concave portions Conc. extending in the row direction are formed on second insulating layer 15 of memory cells MCs as shown in FIG. 26.

Moreover, when concave portions Conc. are filled with a metal layer, control gate electrodes 16 are formed as shown in FIG. 27, to form the array structure of FIG. 1 to FIG. 3. For example, control gate electrode 16 is formed so as to cover memory cells MCs by the sputtering method, and then left only in concave portions Conc. on second insulating layers 15 of memory cells MCs by the CMP.

The above-mentioned second embodiment is different from the first embodiment in that control gate electrodes 16 extend in the row direction and function as word lines WLs.

Here, a heat treatment (annealing) to activate the impurities in impurity regions 18 is executed, before forming control gate electrode 16 as a metal layer and after the ion implantation to form impurity regions 18.

It is to be noted that afterward, when third insulating layers 23 and 25 are selectively removed, the array structure of FIG. 6 and FIG. 7 is formed.

(3) Third Embodiment

The third embodiment relates to a technology of achieving consistency in a process between memory cell MC and transistor (peripheral transistor) Tperi in a peripheral circuit.

Figure 28:
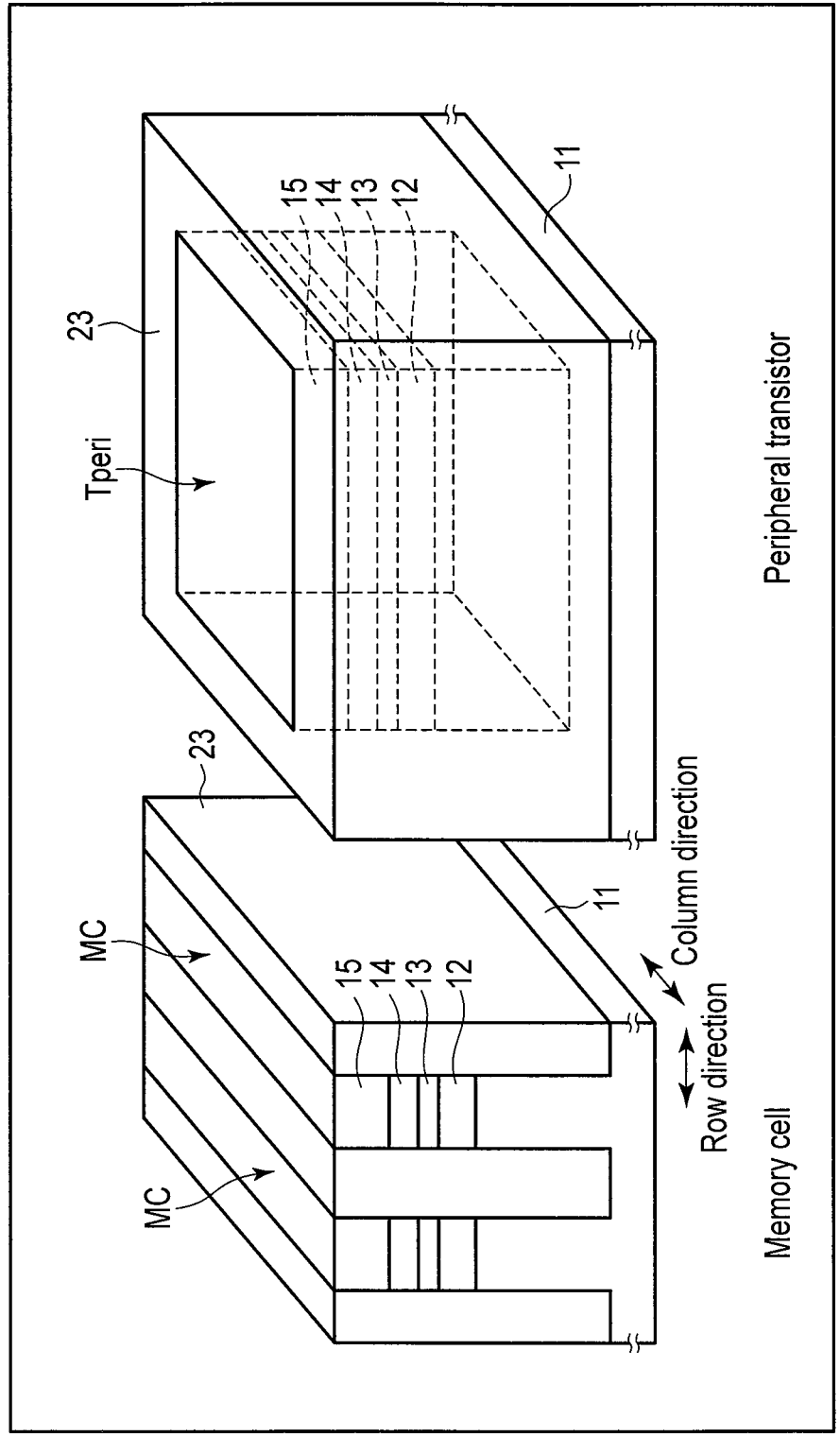

First, as shown in FIG. 28, on semiconductor substrate 11, there are sequentially formed first insulating layer 12, floating gate layer 13, charge trap layer 14, and second insulating layer 15. It is to be noted that when an ultrathin insulating layer is formed between floating gate layer 13 and charge trap layer 14 and then a process described later is executed, the array structure shown in FIG. 4 and FIG. 5 can be obtained.

Moreover, a photoresist layer is formed on second insulating layer 15 by a PEP.

Here, in memory cells MCs, the photoresist layer has line and space patterns arranged at a predetermined pitch in a row direction and extending in a column direction.

Moreover, in peripheral transistor Tperi, a photoresist layer has, for example, a quadrangular shape (a shape of active area AA of the peripheral transistor).

Then, second insulating layer 15, charge trap layer 14, floating gate layer 13, first insulating layer 12 and semiconductor substrate 11 are patterned by RIE using this photoresist layer as a mask. In this patterning, wet etching may be used in place of the RIE.

Afterward, when the photoresist layer is removed, the line and space patterns (gate patterns) of memory cells MCs arranged at the predetermined pitch in the row direction and extending in the column direction are formed. Furthermore, an upper surface of semiconductor substrate 11 has concaves and convexes, and convex portions of semiconductor substrate 11 become active areas AAs.

Moreover, in peripheral transistor Tperi, the quadrangular gate pattern and active area AA are formed.

It is to be noted that the photoresist layer may be replaced with a hard mask layer.

Next, third insulating layers 23 surrounding active areas AAs of memory cells MCs and peripheral transistor Tperi are formed. For example, third insulating layers 23 are formed so as to cover memory cells MC and peripheral transistor Tperi by a sputtering method, and then left only in element separating regions by CMP.

Figure 29:
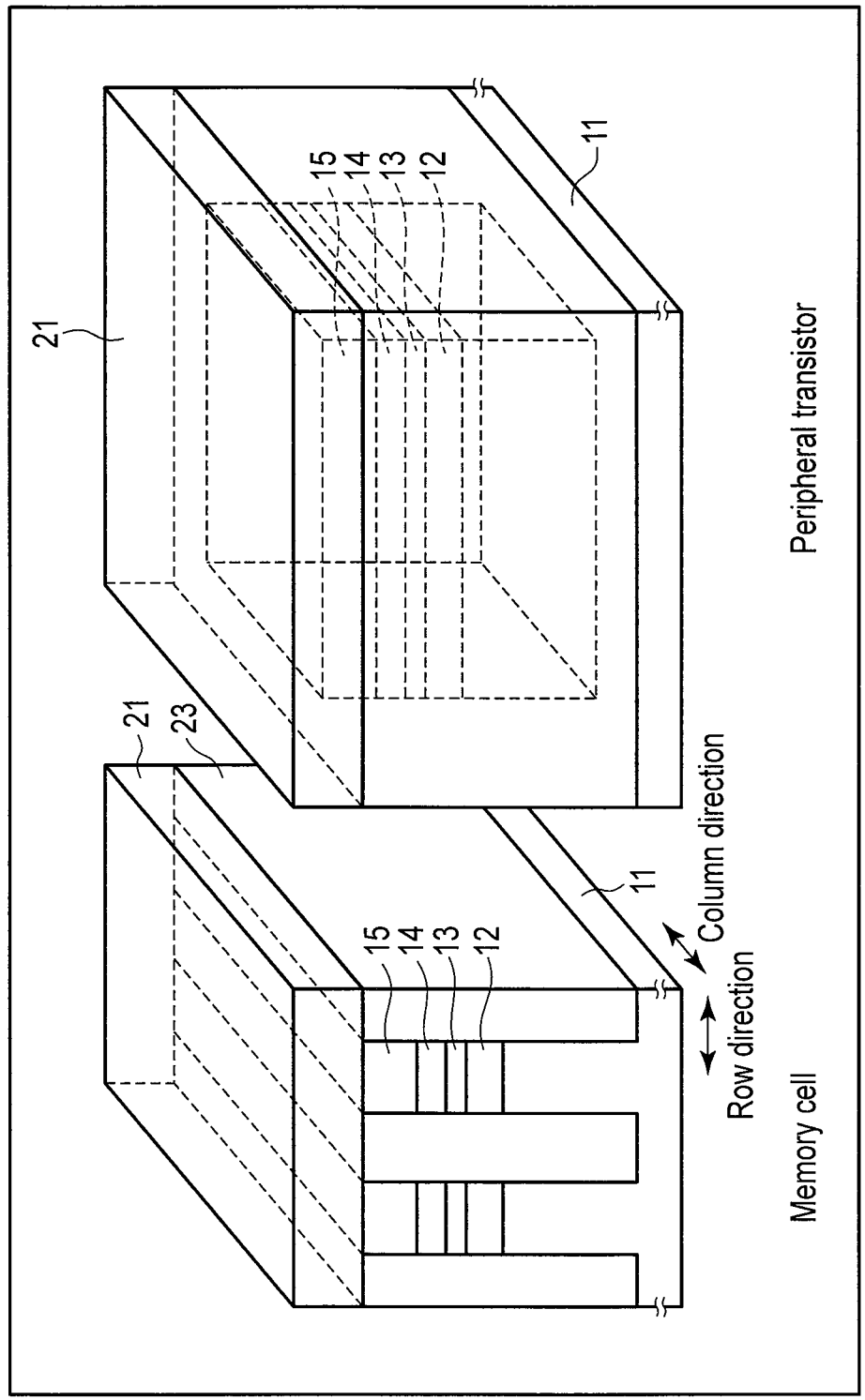

Next, as shown in FIG. 29, dummy layers 21 are formed on second insulating layers 15 and third insulating layers 23. Dummy layer 21 is, for example, a polysilicon layer.

Next, as shown in FIG. 30, photoresist layers 24 are formed on dummy layers 21 by the PEP. In memory cells MC, photoresist layer 24 has line and space patterns arranged at a predetermined pitch in the column direction and extending in the row direction. In peripheral transistor Tperi, photoresist layer 24 has a linear gate pattern.

Then, dummy layer 21, second insulating layer 15, charge trap layer 14, floating gate layer 13 and first insulating layer 12 are patterned by the RIE using photoresist layer 24 as a mask. In this patterning, wet etching may be used in place of the RIE.

Consequently, in memory cells MC, floating gate layer 13 (FG) and charge trap layer 14 (CT) are separated from each other.

Afterward, photoresist layer 24 is removed.

It is to be noted that photoresist layer 24 may be replaced with a hard mask layer.

Next, as shown in FIG. 31 and FIG. 32, in memory cells MCs, impurity region 18 is formed in semiconductor substrate (active area AA) 11 in a space between memory cells MCs arranged in the column direction by an ion implantation.

Moreover, in peripheral transistor Tperi, impurity regions 18 are formed in semiconductor substrates (active areas AAs) 11 on right and left sides of a gate pattern by the ion implantation. In peripheral transistor Tperi, side wall insulating layers 20 may be formed on side walls of the gate pattern.

Next, as shown in FIG. 33, a concave portion on impurity region 18 between memory cells MCs arranged in the column direction and concave portions on impurity regions 18 of peripheral transistor Tperi are filled with third insulating layers 25, respectively.

For example, third insulating layers 25 are formed so as to cover memory cells MCs and peripheral transistor Tperi by the sputtering method, and then left in the concave portion on impurity region 18 between memory cells MCs and the concave portions on impurity regions 18 of peripheral transistor Tperi by the CMP, respectively.

It is to be noted that third insulating layers 23 and 25 are preferably made of the same material.

Figure 34:
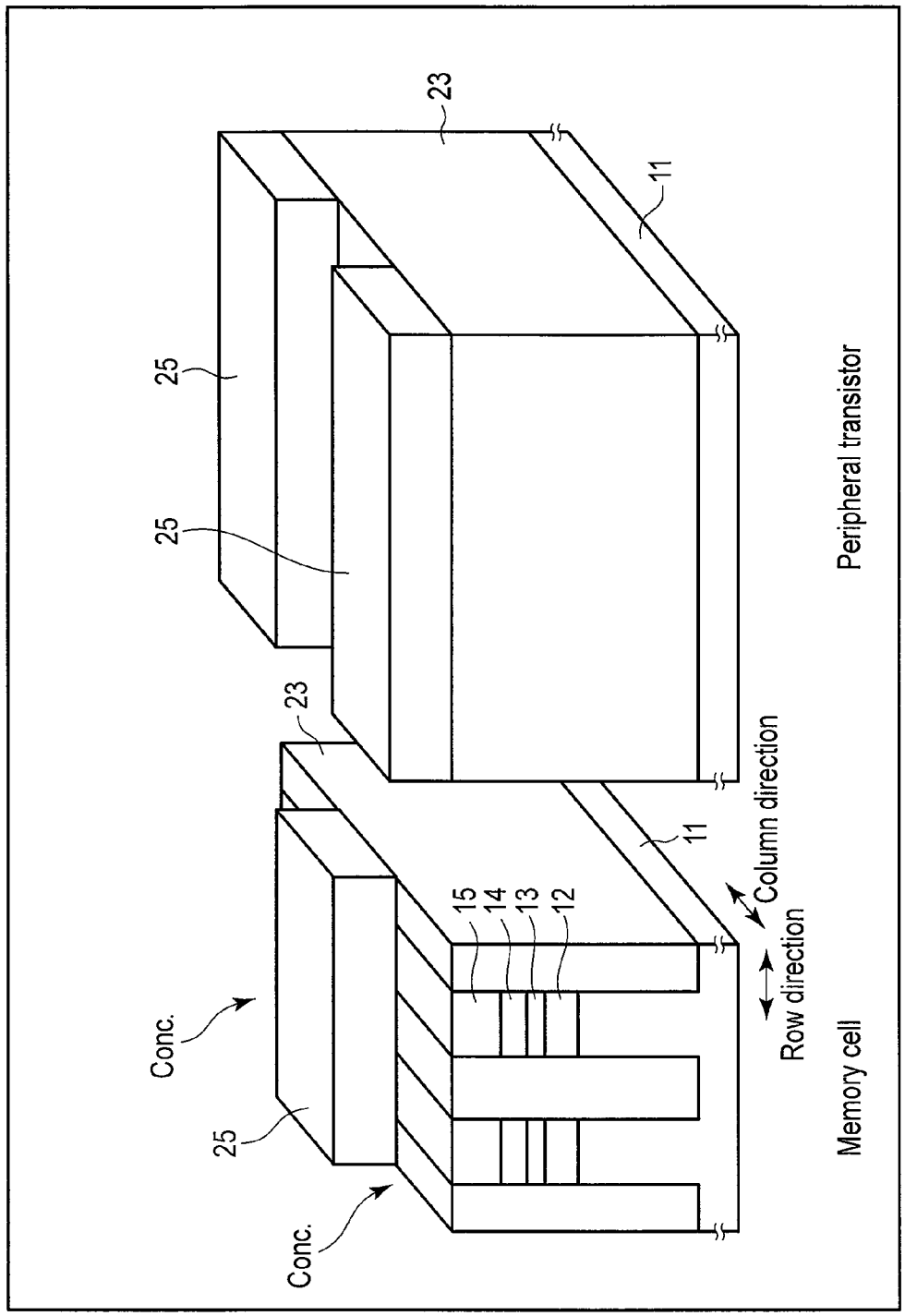
Figure 35:
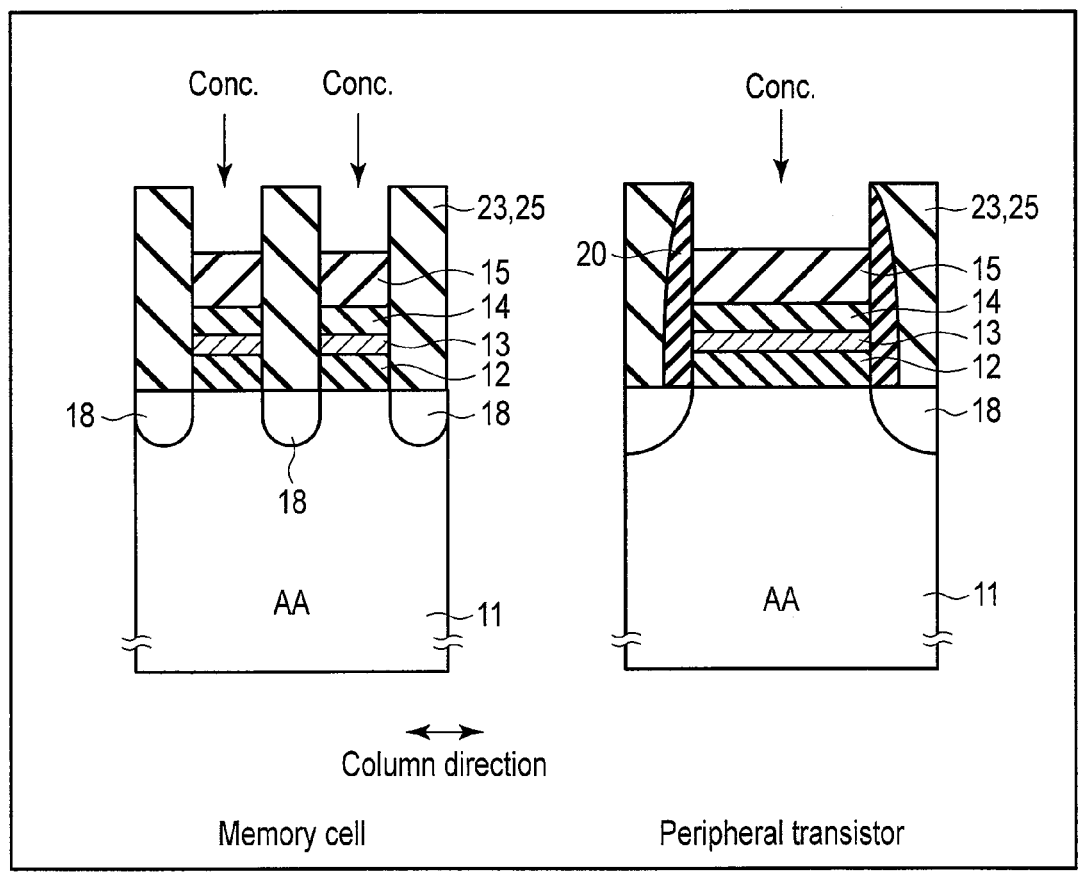

Afterward, when dummy layers 21 are selectively removed, concave portions Conc. extending in the row direction are formed on second insulating layer 15 of memory cells MCs, and linear concave portion Conc. is formed on second insulating layer 15 of peripheral transistor Tperi as shown in FIG. 34 and FIG. 35.

Figure 36:
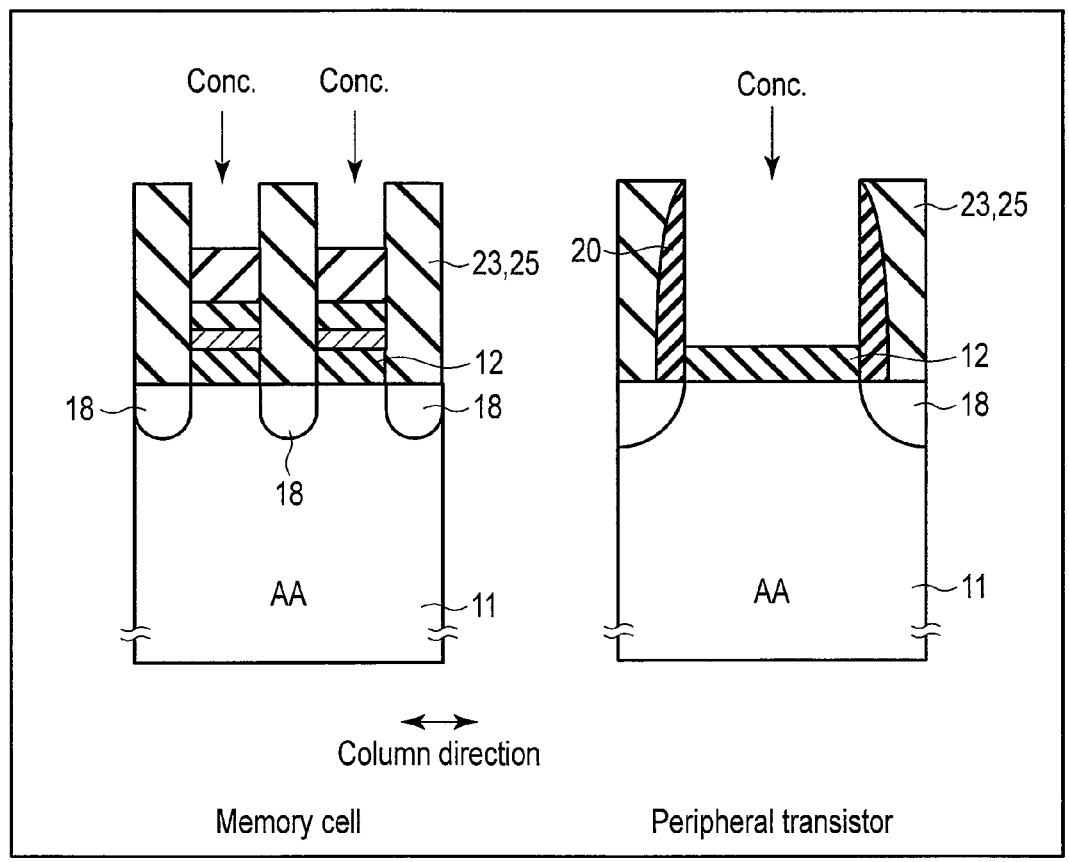

Moreover, as shown in FIG. 36, in the present embodiment, further in peripheral transistor Tperi, second insulating layer 15, charge trap layer 14 and floating gate layer 13 are selectively removed, respectively.

Figure 37:
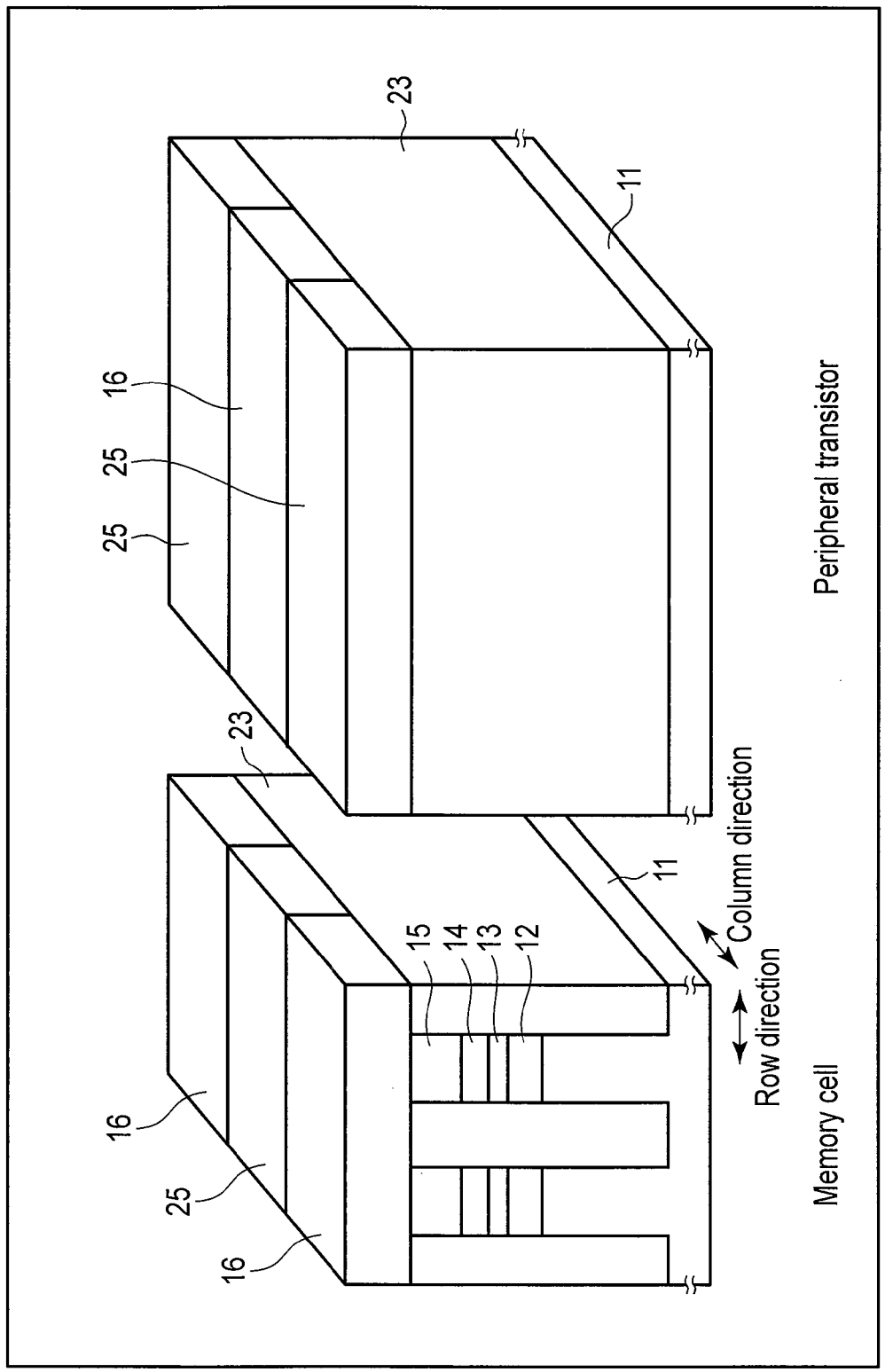
Figure 38:
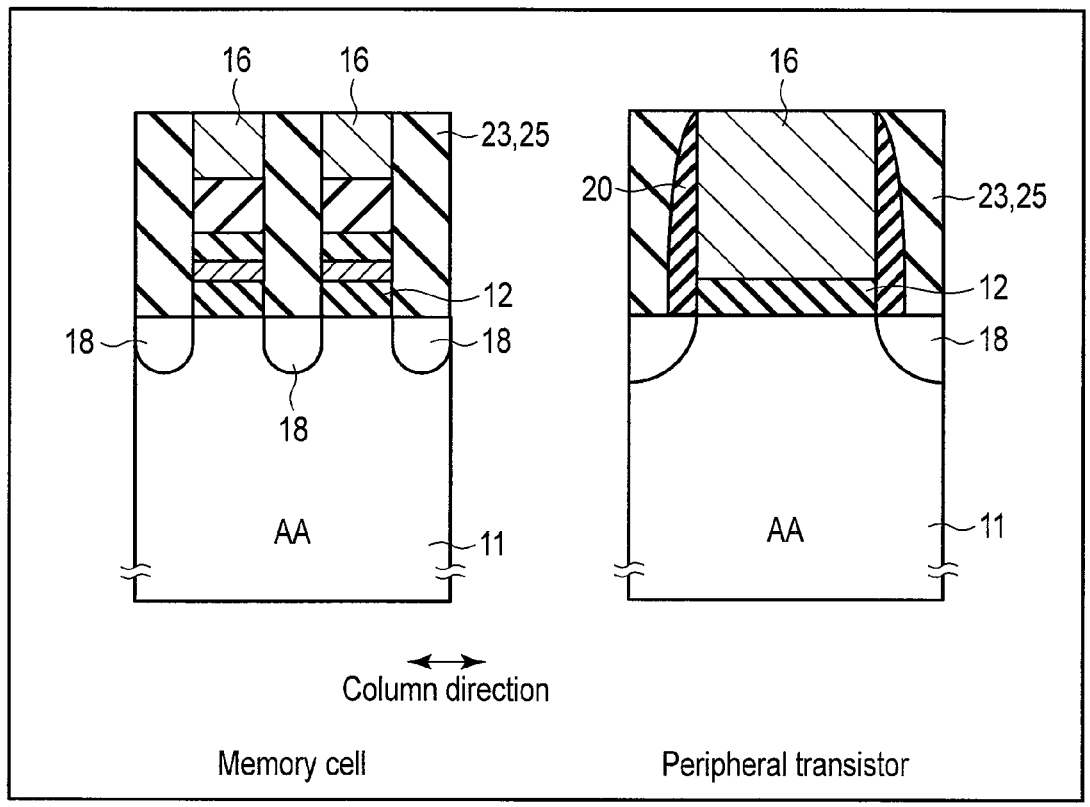

Furthermore, when concave portions Conc. are filled with a metal layer, control gate electrodes 16 are formed in memory cells MC as shown in FIG. 37 and FIG. 38, to form the array structure of FIG. 1 to FIG. 3. Additionally, in selection transistor Tperi, logic gate electrode 16 is formed.

It is to be noted that control gate electrodes/logic gate electrode 16 are formed so as to cover memory cells MCs and peripheral transistor Tperi by the sputtering method, and then left only in concave portions Conc. on second insulating layer 15 of memory cells MCs and concave portion Conc. on first insulating layer 12 of peripheral transistor Tperi by the CMP.

Here, a heat treatment (annealing) to activate impurities in impurity regions 18 is executed, before forming control gate electrodes/logic gate electrode 16 as metal layers and after the ion implantation to form impurity regions 18.

It is to be noted that afterward, when third insulating layers 23 and 25 are selectively removed, the array structure of FIG. 6 and FIG. 7 is formed.

Figure 39:
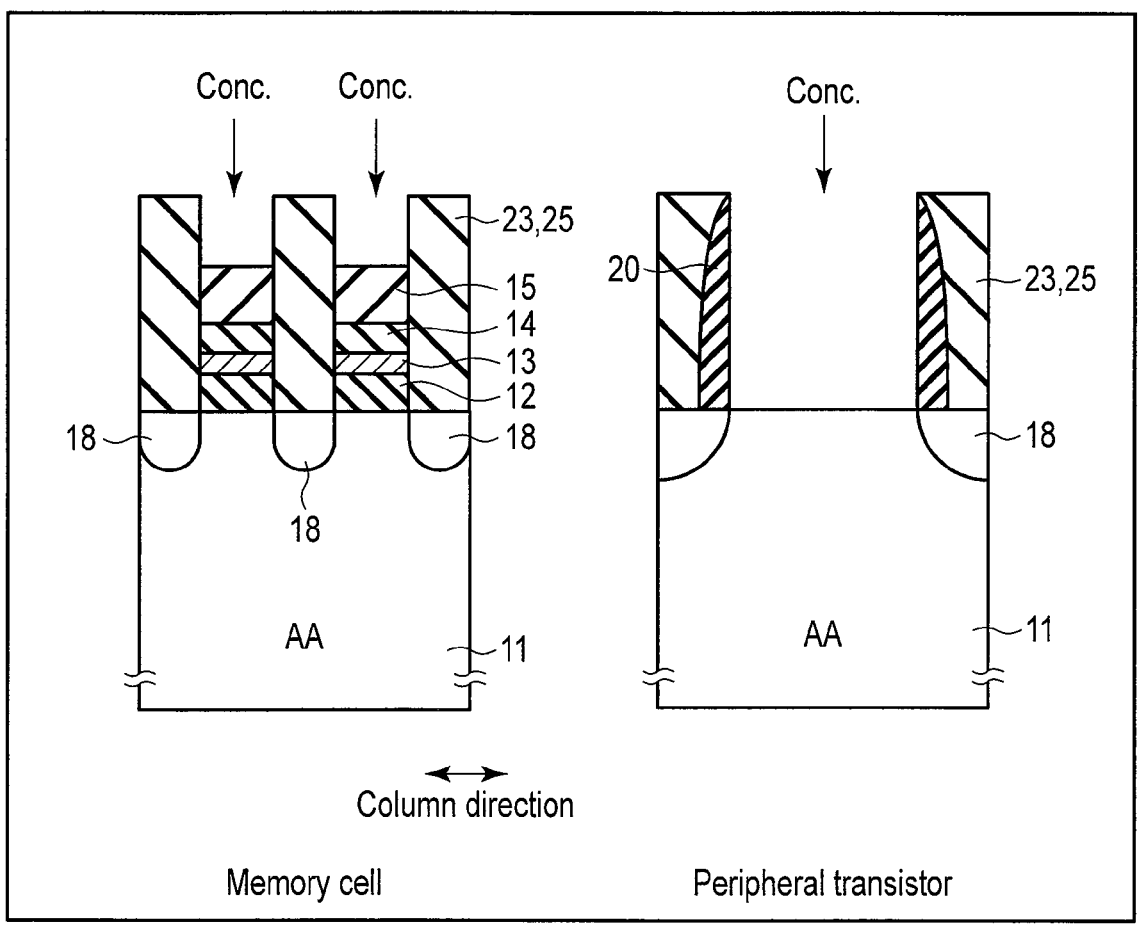
Figure 40:
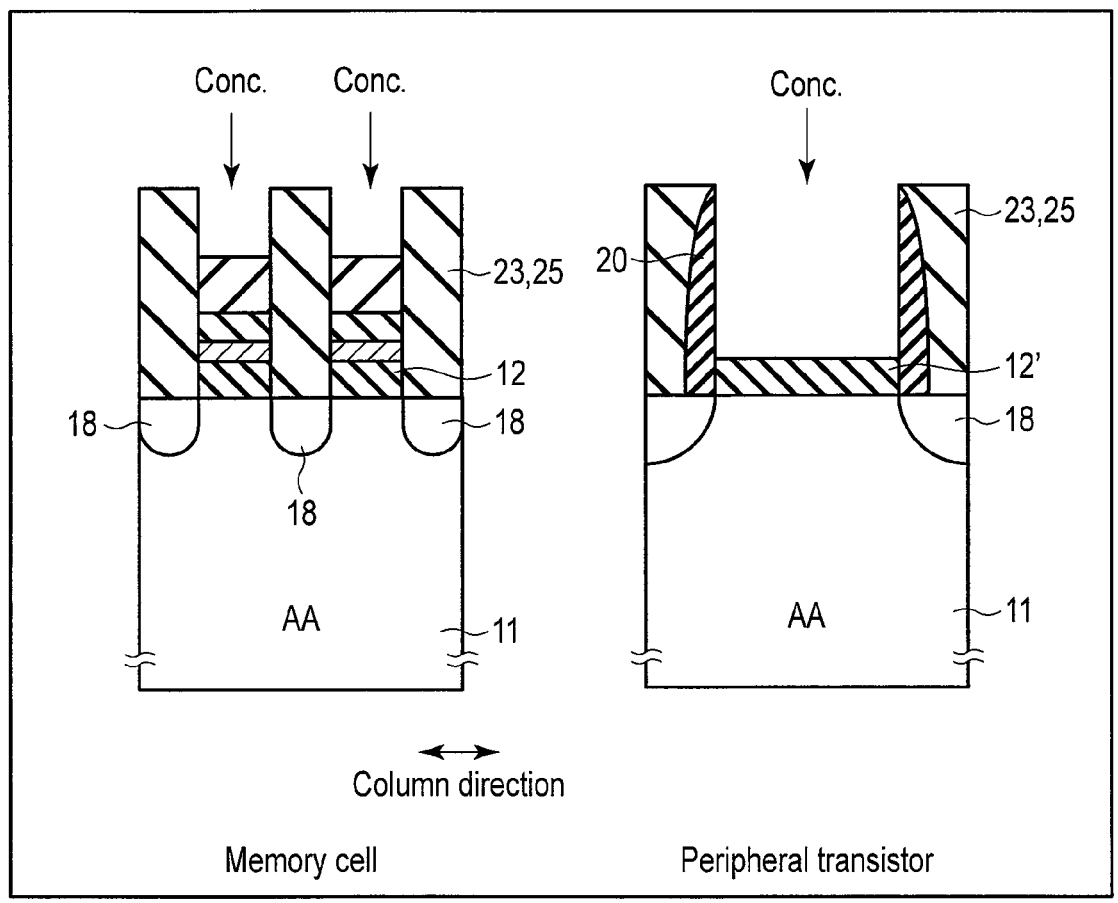

FIG. 39 to FIG. 41 show a first modification of the third embodiment.

In this modification, as shown in FIG. 39, in peripheral transistor Tperi, dummy layer 21, second insulating layer 15, charge trap layer 14, floating gate layer 13 and first insulating layer 12 are selectively removed, respectively.

Moreover, as shown in FIG. 40, in peripheral transistor Tperi, first insulating layer 12' is newly formed on semiconductor substrate (active area AA) 11.

Then, as shown in FIG. 41, in peripheral transistor Tperi, a space on first insulating layer 12' in concave portion Conc. is filled with logic gate electrode 16 as a metal layer.

Also in such a process, a heat treatment (annealing) to activate impurities in impurity regions 18 is executed, before forming control gate electrodes/logic gate electrode 16 as metal layers and after an ion implantation to form impurity regions 18.

FIG. 42 and FIG. 43 show a second modification of the third embodiment.

In this modification, as shown in FIG. 42, in peripheral transistor Tperi, dummy layer 21, second insulating layer 15 and charge trap layer 14 are selectively removed, respectively. Then, as shown in FIG. 43, in peripheral transistor Tperi, a space on floating gate layer 13 in concave portion Conc. is filled with logic gate electrode 16 as a metal layer.

Also in such a process, a heat treatment (annealing) to activate impurities in impurity regions 18 is executed, before forming control gate electrodes/logic gate electrode 16 as the metal layers and after an ion implantation to form impurity regions 18.

In this modification, when floating gate layer 13 is a polysilicon layer, a metal compound layer (a metal silicide layer) may be formed in concave portion Conc. by reacting floating gate layer (polysilicon layer) 13 chemically with control gate electrode (metal layer) 16.

3. Application Example

In the above-mentioned embodiments, an array structure (memory cell MC) is not limited to an NAND type. Memory cell MC may be a flash memory cell having a flat cell structure and a hybrid structure. Moreover, the above-mentioned embodiments are examples of a two-dimensional memory, but can be applied to a three-dimensional memory in which memory cells MCs are stacked on semiconductor substrate 11. Furthermore, memory cell MC may be a binary memory capable of storing a binary, or a multilevel memory capable of storing a multivalue of a ternary or more.

4. Conclusion

According to embodiments, in a nonvolatile semiconductor memory device in which a flat cell structure and a hybrid structure are combined, it is possible to realize a manufacturing method in which writing/erasing characteristics are not deteriorated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device, the method comprising:
    forming first and second gate patterns each including a structure stacked in order of a first insulating layer, a floating gate layer, a charge trap layer, a second insulating layer and a dummy layer on a semiconductor layer;
    implanting impurities in the semiconductor layer by an ion implantation using the first and second gate patterns as a mask;
    forming a third insulating layer on the semiconductor layer, the third insulating layer covering side surfaces of the first and second gate patterns;
    forming first and second concave portions, the first concave portion formed by removing the dummy layer of the first gate pattern, the second concave portion formed by removing the dummy layer, the second insulating layer, the charge trap layer and the floating gate layer of the second gate pattern;
    forming a metal layer on the second insulating layer in the first concave portion and on the first insulating layer in the second concave portion; and
    executing a heat treatment to activate the impurities, before forming the metal layer and after the ion implantation.

2. The method of claim 1,
    wherein the charge trap layer comprises a fourth insulating layer with a function as trapping charges, and a fifth insulating layer with a thickness of 10 nm or less between the floating gate layer and the fourth insulating layer.

3. The method of claim 1,
    wherein the first gate pattern is a gate pattern of a memory cell.

4. The method of claim 3,
    wherein the first insulating layer in the first concave portion is a gate insulating layer of the memory cell.

5. The method of claim 1,
    wherein the second gate pattern is a gate pattern of a peripheral transistor.

6. The method of claim 5,
    wherein the first insulating layer in the second concave portion is a gate insulating layer of the peripheral transistor.

7. A method of manufacturing a nonvolatile semiconductor memory device, the method comprising:
    forming first and second gate patterns each including a structure stacked in order of a first insulating layer, a floating gate layer, a charge trap layer, a second insulating layer and a dummy layer on a semiconductor layer;
    implanting impurities in the semiconductor layer by an ion implantation using the first and second gate patterns as a mask;
    forming a third insulating layer on the semiconductor layer, the third insulating layer covering side surfaces of the first and second gate patterns;
    forming first and second concave portions, the first concave portion formed by removing the dummy layer of the first gate pattern, the second concave portion formed by removing the dummy layer, the second insulating layer, the charge trap layer, the floating gate layer and the first insulating layer of the second gate pattern;
    forming a gate insulating layer on the semiconductor layer in the second concave portion;
    forming a metal layer on the second insulating layer in the first concave portion and on the gate insulating layer in the second concave portion; and
    executing a heat treatment to activate the impurities, before forming the metal layer and after the ion implantation.

8. The method of claim 7,
    wherein the charge trap layer comprises a fourth insulating layer with a function as trapping charges, and a fifth insulating layer with a thickness of 10 nm or less between the floating gate layer and the fourth insulating layer.

9. The method of claim 7,
    wherein the first gate pattern is a gate pattern of a memory cell.

10. The method of claim 9,
    wherein the first insulating layer in the first concave portion is a gate insulating layer of the memory cell.

11. The method of claim 7,
    wherein the second gate pattern is a gate pattern of a peripheral transistor.

12. A method of manufacturing a nonvolatile semiconductor memory device, the method comprising:
    forming first and second gate patterns each including a structure stacked in order of a first insulating layer, a floating gate layer, a charge trap layer, a second insulating layer and a dummy layer on a semiconductor layer;
    implanting impurities in the semiconductor layer by an ion implantation using the first and second gate patterns as a mask;
    forming a third insulating layer on the semiconductor layer, the third insulating layer covering side surfaces of the first and second gate patterns;
    forming first and second concave portions, the first concave portion formed by removing the dummy layer of the first gate pattern, the second concave portion formed by removing the dummy layer, the second insulating layer and the charge trap layer of the second gate pattern;
    forming a metal layer on the second insulating layer in the first concave portion and on the floating gate layer in the second concave portion; and
    executing a heat treatment to activate the impurities, before forming the metal layer and after the ion implantation.

13. The method of claim 12, further comprising:
forming a metal compound layer in the second concave portion by reacting the floating gate layer chemically with the metal layer.

14. The method of claim 12,
wherein the charge trap layer comprises a fourth insulating layer with a function as trapping charges, and a fifth insulating layer with a thickness of 10 nm or less between the floating gate layer and the fourth insulating layer.

15. The method of claim 12,
wherein the first gate pattern is a gate pattern of a memory cell.

16. The method of claim 15,
wherein the first insulating layer in the first concave portion is a gate insulating layer of the memory cell.

17. The method of claim 12,
wherein the second gate pattern is a gate pattern of a peripheral transistor.

18. The method of claim 17,
wherein the first insulating layer in the second concave portion is a gate insulating layer of the peripheral transistor.

* * * * *